(12) United States Patent
Shoji et al.

(10) Patent No.: US 9,711,524 B2
(45) Date of Patent: Jul. 18, 2017

(54) THREE-DIMENSIONAL MEMORY DEVICE CONTAINING PLURAL SELECT GATE TRANSISTORS HAVING DIFFERENT CHARACTERISTICS AND METHOD OF MAKING THEREOF

(71) Applicant: SANDISK TECHNOLOGIES, INC., Plano, TX (US)

(72) Inventors: Go Shoji, Yokkaichi (JP); Hiroyuki Ogawa, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 24 days.

(21) Appl. No.: 14/595,572

(22) Filed: Jan. 13, 2015

(65) Prior Publication Data
US 2016/0204122 A1 Jul. 14, 2016

(51) Int. Cl.
*H01L 27/115* (2017.01)
*H01L 27/11582* (2017.01)
*H01L 27/11565* (2017.01)
*H01L 27/11575* (2017.01)
*H01L 21/223* (2006.01)

(52) U.S. Cl.
CPC .. *H01L 27/11582* (2013.01); *H01L 27/11565* (2013.01); *H01L 27/11575* (2013.01); *H01L 21/223* (2013.01); *H01L 21/2236* (2013.01)

(58) Field of Classification Search
None
See application file for complete search history.

(56) References Cited

U.S. PATENT DOCUMENTS

| 5,915,167 | A | 6/1999 | Leedy | |
| 8,598,647 | B2 * | 12/2013 | Kim | H01L 27/11556 257/315 |
| 8,624,316 | B2 * | 1/2014 | Mizushima | H01L 21/28282 257/324 |

(Continued)

OTHER PUBLICATIONS

Endoh, et al., "Novel Ultra High Density Memory with a Stacked-Surrounding Gate Transistor (S-SGT) Structured Cell," IEDM Proc. (2001) 33-36.

(Continued)

*Primary Examiner* — Abul Kalam
(74) *Attorney, Agent, or Firm* — The Marbury Law Group PLLC

(57) ABSTRACT

A stack of material layers includes first material layers, second material layers located between a respective pair of an overlying first material layer and an underlying first material layer, and at least one temporary material layer located between a respective pair of an overlying first material layer and an underlying first material layer. After formation of a memory opening and a memory stack structure, at least one first backside recess is formed by removing the at least one temporary material layer and adjoining portions of a memory film. A physically exposed portion of a semiconductor channel is doped with electrical dopants to form a doped semiconductor channel portion. Second backside cavities are formed by removal of the second material layers. The backside cavities are then filled with a dielectric liner and electrically conductive layers, such as select and control gate electrodes of a memory device.

31 Claims, 15 Drawing Sheets

(56) References Cited

U.S. PATENT DOCUMENTS

| | | | |
|---|---|---|---|
| 8,916,926 B2* | 12/2014 | Choe | H01L 27/1157 |
| | | | 257/324 |
| 2012/0112260 A1* | 5/2012 | Kim | H01L 27/11556 |
| | | | 257/315 |
| 2012/0139027 A1* | 6/2012 | Son | H01L 29/7926 |
| | | | 257/324 |
| 2012/0140562 A1* | 6/2012 | Choe | H01L 27/1157 |
| | | | 365/185.18 |
| 2012/0156848 A1* | 6/2012 | Yang | H01L 27/11529 |
| | | | 438/287 |
| 2013/0095622 A1* | 4/2013 | Jee | H01L 29/7889 |
| | | | 438/264 |
| 2013/0161725 A1* | 6/2013 | Park | H01L 29/7926 |
| | | | 257/324 |

OTHER PUBLICATIONS

U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.

* cited by examiner

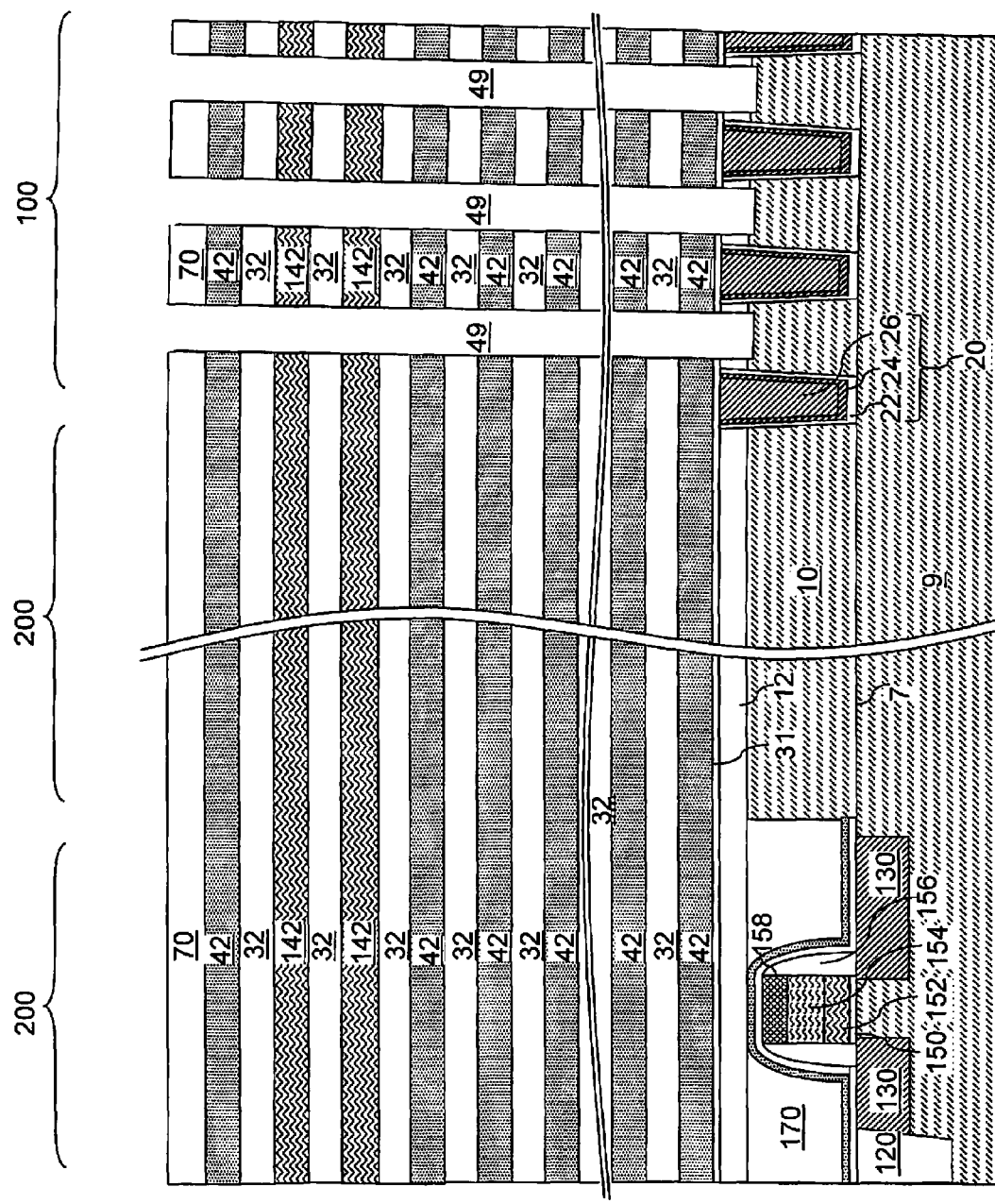

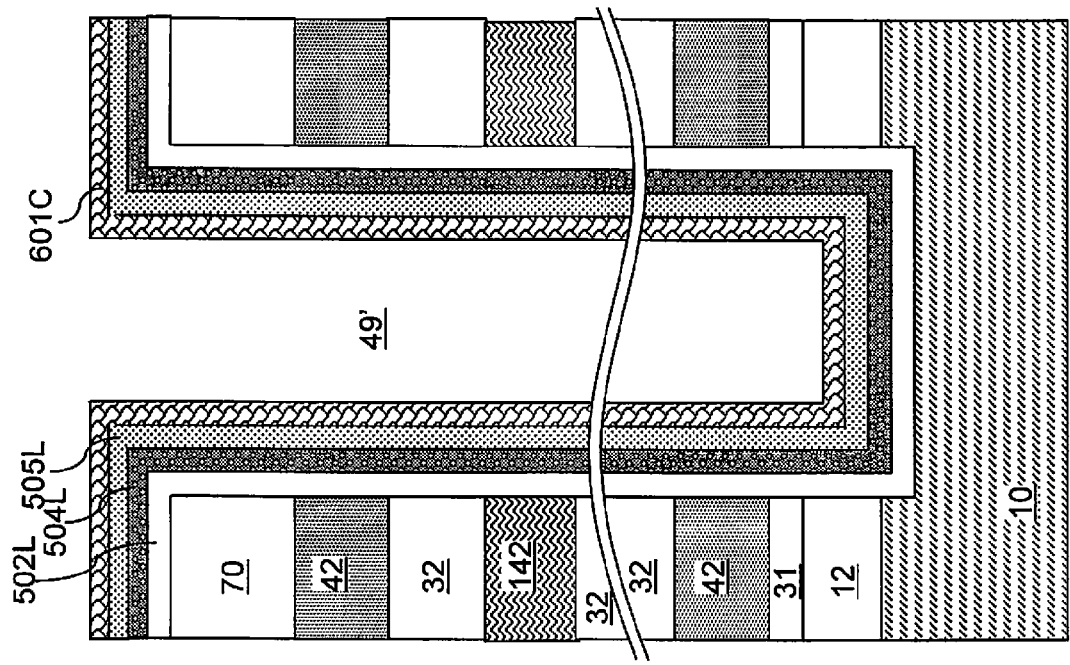
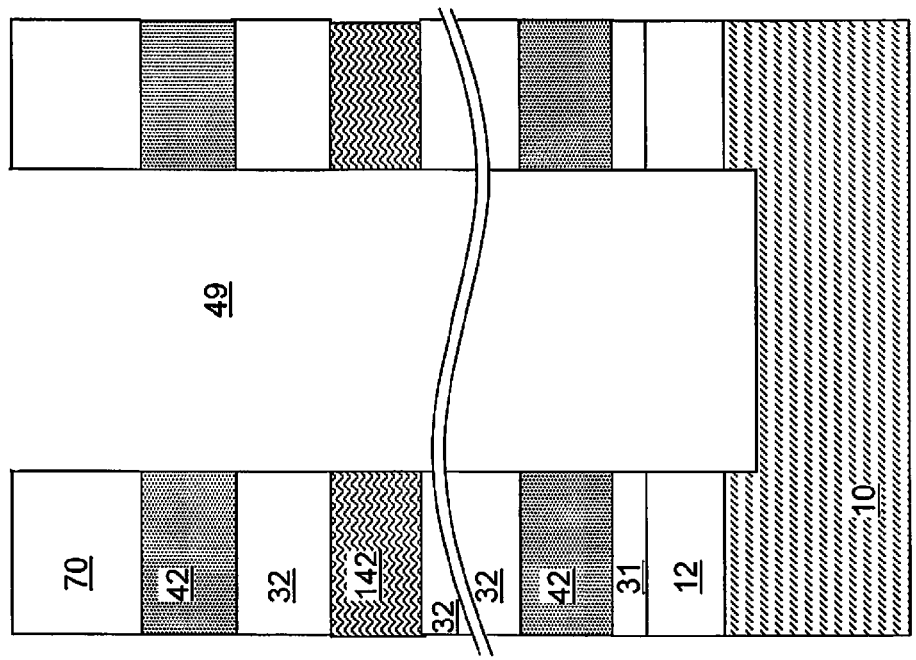
FIG. 2B
FIG. 2A

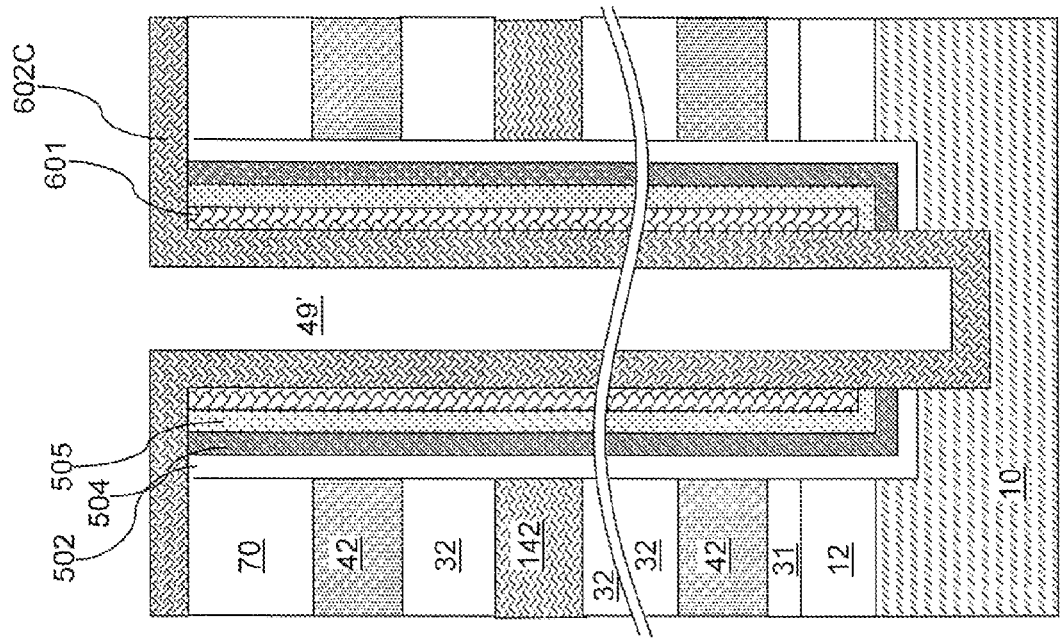
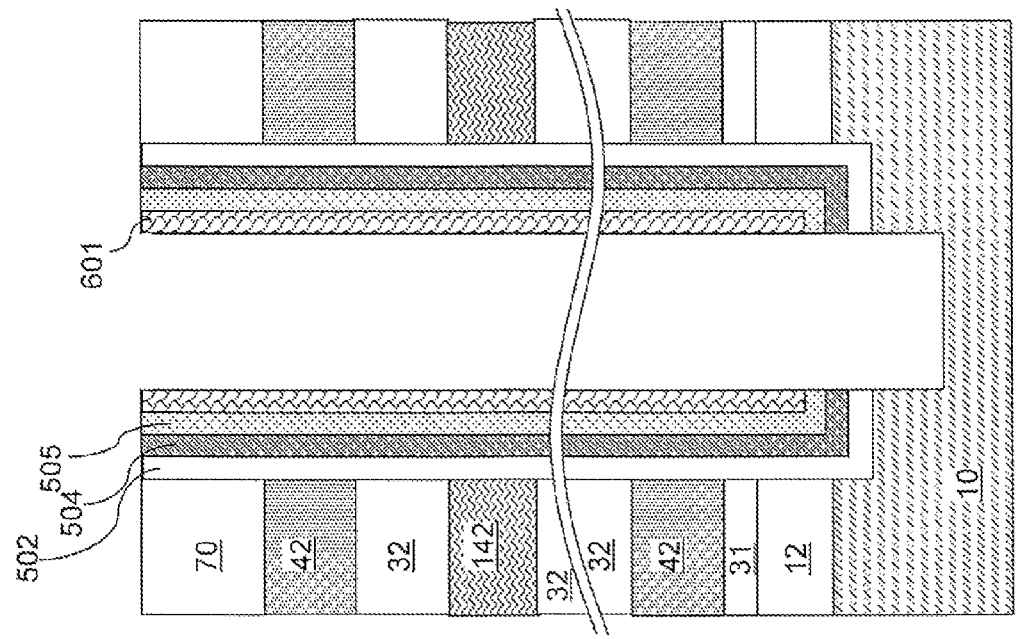
FIG. 2D
FIG. 2C

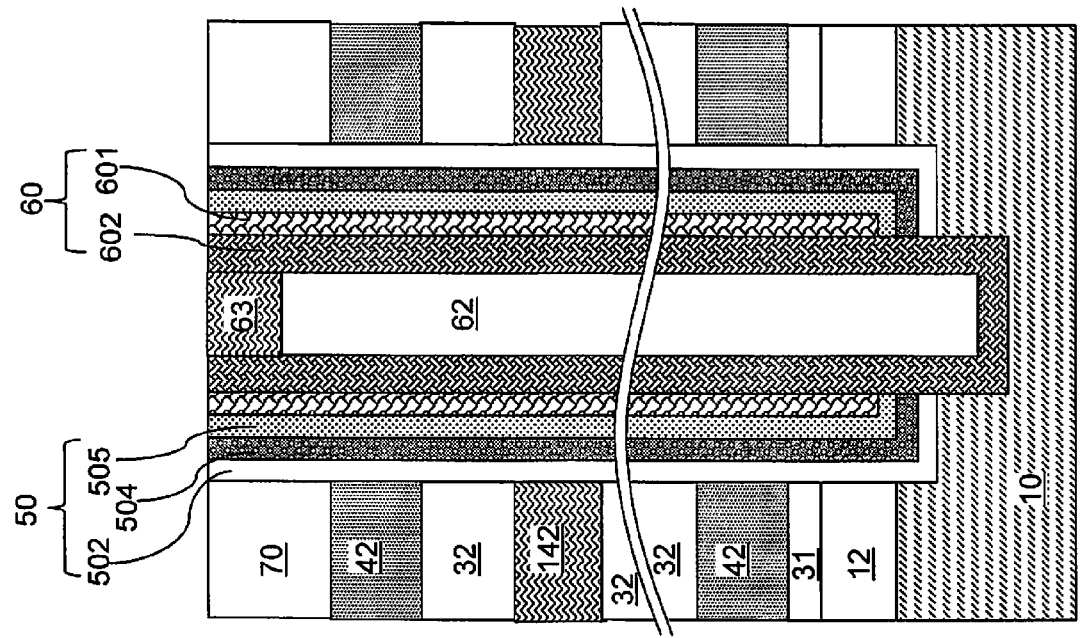
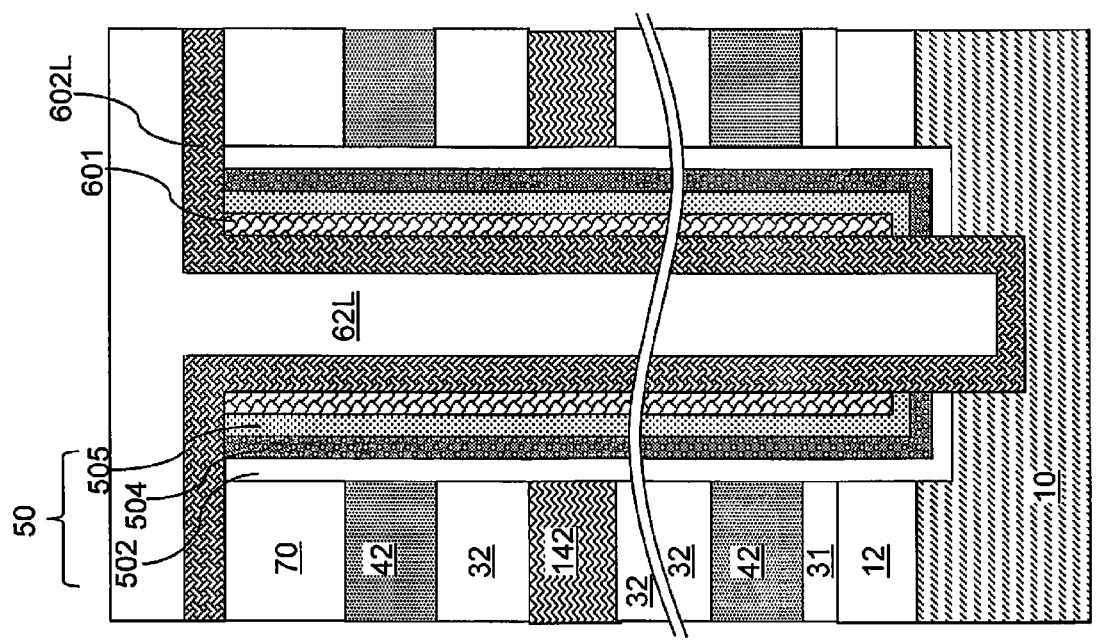

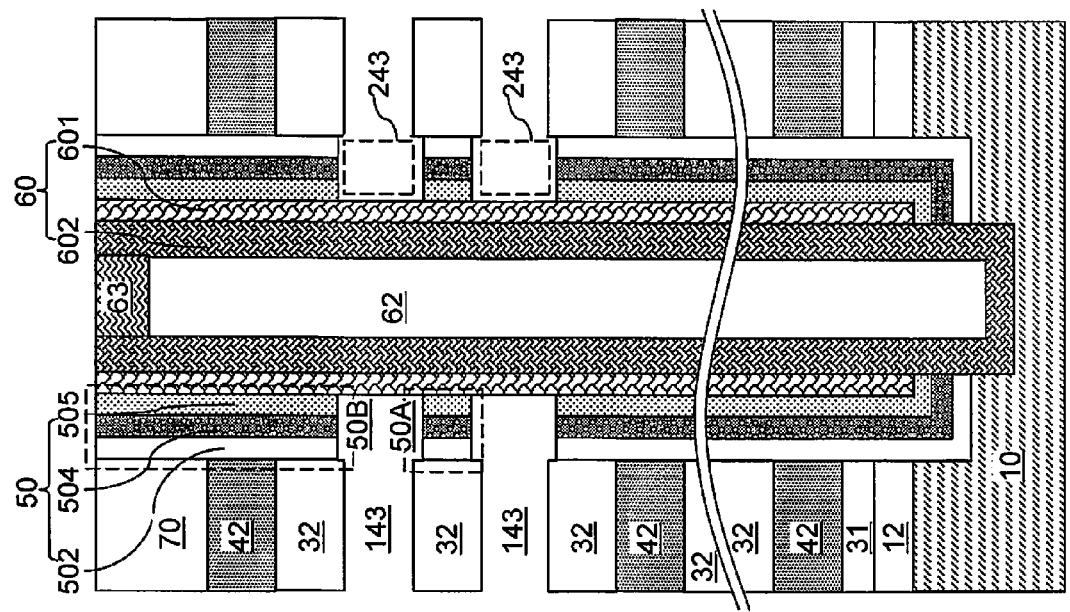
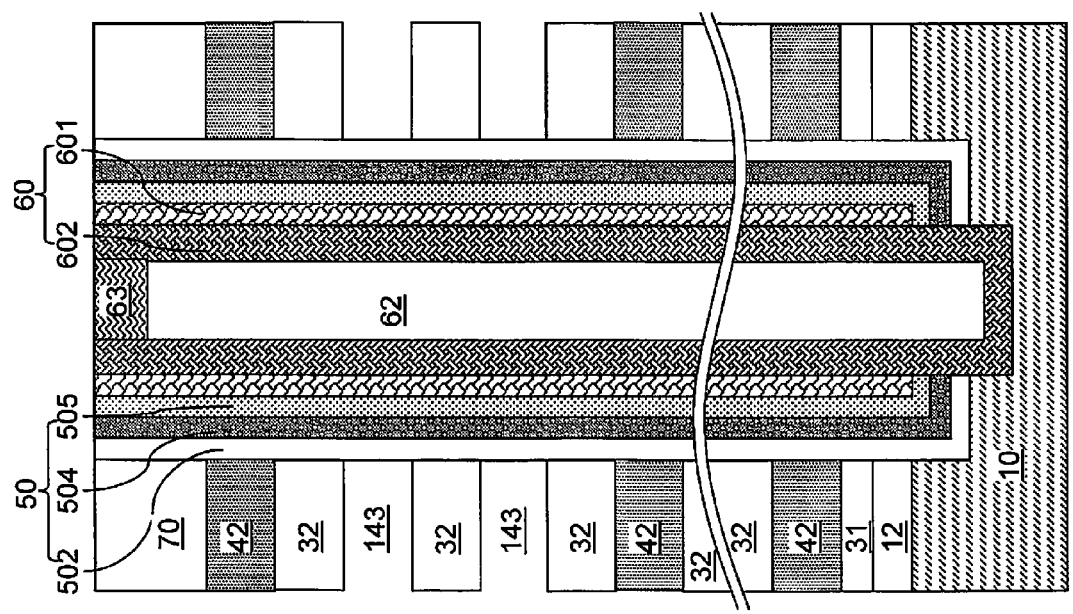

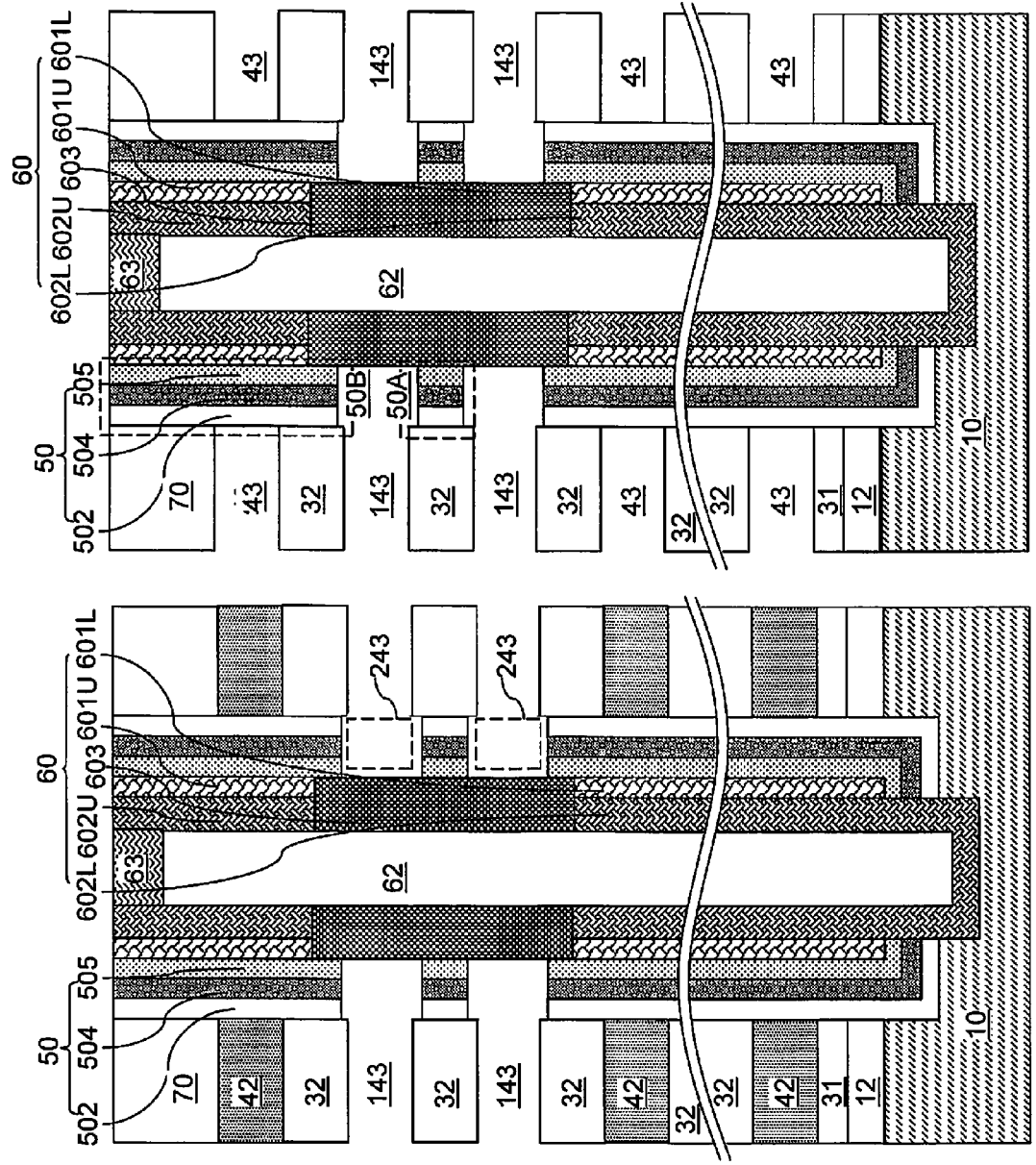

ated in an article by T. Endoh, et. al., titled "Novel Ultra High Density Memory With A Stacked-Surrounding Gate Transistor (S-SGT) Structured Cell", IEDM Proc. (2001) 33-36.

THREE-DIMENSIONAL MEMORY DEVICE CONTAINING PLURAL SELECT GATE TRANSISTORS HAVING DIFFERENT CHARACTERISTICS AND METHOD OF MAKING THEREOF

FIELD

The present disclosure relates generally to the field of semiconductor devices and specifically to three-dimensional memory structures, such as vertical NAND strings, and other three-dimensional devices and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory structure is provided, which comprises a stack including an alternating plurality of insulator layers and electrically conductive layers located over a substrate, a memory opening extending through the stack, and a memory film and a semiconductor channel located within the memory opening. The semiconductor channel comprises a first semiconductor channel portion having a first material composition that includes a semiconductor material, and a second semiconductor channel portion contacting an upper end of the first semiconductor channel portion and having a doping of a first conductivity type. The first semiconductor channel portion is intrinsic or has a doping of the first conductivity type at a lower dopant concentration than the second semiconductor channel portion. The semiconductor channel further comprises a drain region located above the second semiconductor channel portion, having a doping of a second conductivity type that is the opposite of the first conductivity type, and contacting an upper end of the semiconductor channel.

According to another aspect of the present disclosure, a method of manufacturing a three-dimensional memory structure is provided. A stack of material layers is formed over a substrate. The stack comprising first material layers, second material layers located between a respective pair of an overlying first material layer and an underlying first material layer, and at least one temporary material layer located between a respective pair of an overlying first material layer and an underlying first material layer. A memory opening is formed through the stack. A memory film and a semiconductor channel are formed in the memory opening. A drain region is formed on the semiconductor channel. At least one first backside recess is formed by removing the at least one temporary material layer and each portion of the memory film that adjoins the at least one temporary material layer, wherein each first backside recess laterally extends to a respective portion of an outer sidewall of the semiconductor channel. Electrical dopants are introduced through each physically exposed portion of the outer sidewall of the semiconductor channel and into each respective adjoining portion of the semiconductor channel, which is converted into a doped semiconductor channel portion that is present within the semiconductor channel.

According to yet another aspect of the present disclosure, a monolithic three-dimensional memory structure is provided, which comprises a stack including an alternating plurality of insulator layers and electrically conductive layers located over a substrate, a memory opening extending through the stack, a memory film and a semiconductor channel located within the memory opening, and a blocking dielectric layer extending through the stack. A first subset of the electrically conductive layers is laterally spaced from the semiconductor channel by a combination of a respective portion of the memory film and a respective portion of the backside blocking dielectric layer. A second subset of the electrically conductive layers is laterally spaced from the semiconductor channel portion by no more than a respective portion of the backside blocking dielectric layer.

According to yet another aspect of the present disclosure, a monolithic three-dimensional memory structure is provided, which comprises a stack including an alternating plurality of insulator layers and electrically conductive layers located over a substrate, a memory opening extending through the stack, a memory film located within the memory opening, and a semiconductor channel located within the memory opening. The semiconductor channel comprises a first intrinsic semiconductor channel portion and a second doped semiconductor channel portion contacting an upper end of the first intrinsic semiconductor channel portion. A first subset of the electrically conductive layers comprises a plurality of control gate electrodes and at least one first drain select gate electrode which are located laterally adjacent to the first semiconductor channel portion. A second subset of the electrically conductive layers comprises at least one second drain select gate electrode which is located laterally adjacent to the second semiconductor channel portion.

BRIEF DESCRIPTION OF THE DRAWINGS

FIG. 1 is a vertical cross-sectional view of an exemplary structure after formation of a stack including first material layers, second material layers, and temporary material layers, and memory openings according to an embodiment of the present disclosure.

FIGS. 2A-2F is a sequential vertical cross-sectional view of a memory opening during formation of a memory stack structure according to an embodiment of the present disclosure.

FIGS. 7A-7E are vertical cross-sectional views of a memory stack structure during formation of first and second backside cavities, a dielectric liner, and electrically conductive layers according to an embodiment of the present disclosure.

DETAILED DESCRIPTION

Figure 3:
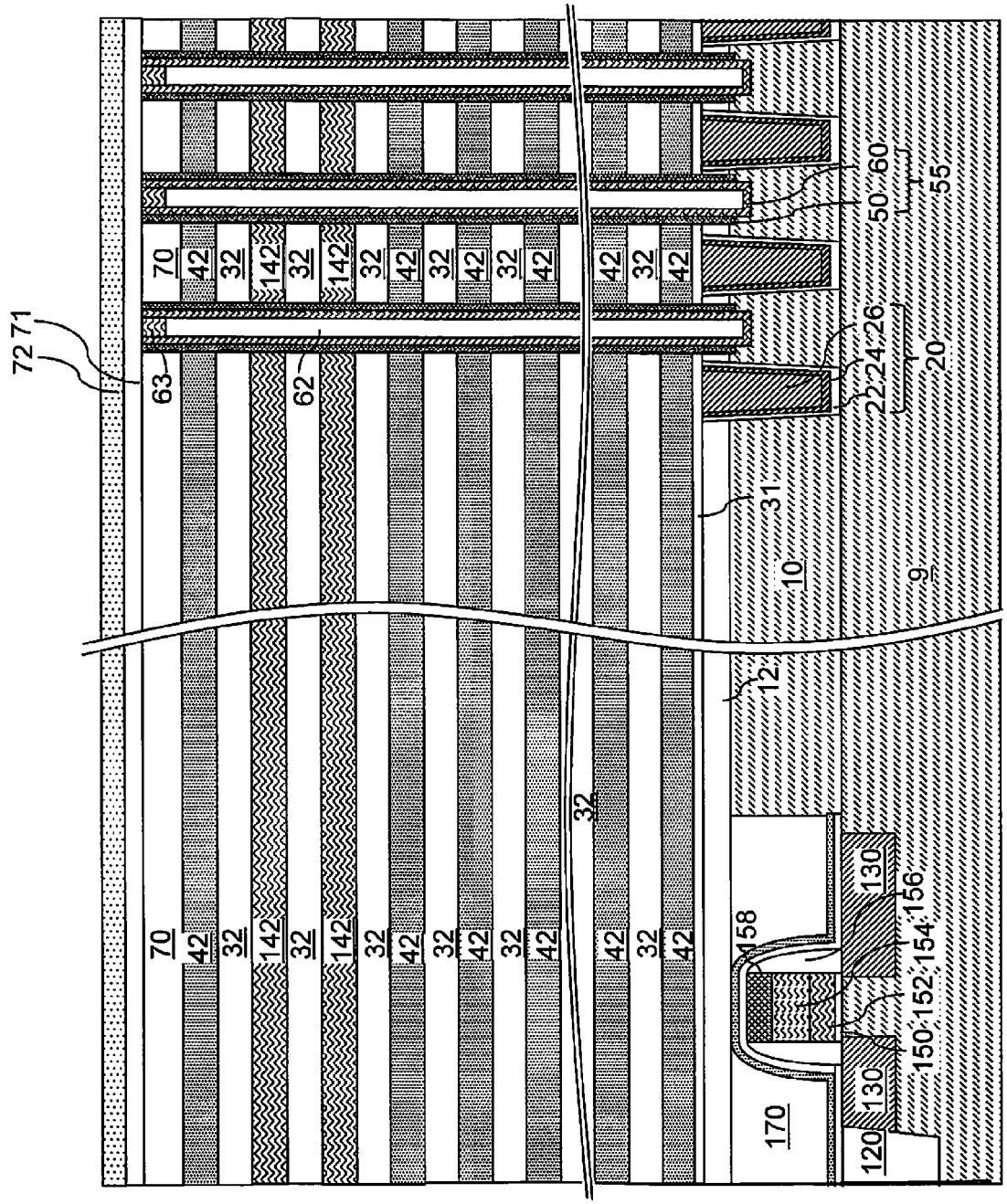
FIG. 3 is a vertical cross-sectional view of the exemplary structure after formation of memory stack structures and at least one dielectric cap layer according to an embodiment of the present disclosure.

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0\times10^{-6}$ S/cm to $1.0\times10^{5}$ S/cm, and is capable of producing a doped material having electrical resistivity in a range from 1.0 S/cm to $1.0\times10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 160 and a second dielectric liner 162 can be optionally formed. Each of the first and second dielectric liners (160, 162) can comprise a silicon oxide layer, a silicon nitride layer, and/or a dielectric metal oxide layer. In an illustrative example, the first dielectric liner 160 can be a silicon oxide layer, and the second dielectric liner 162 can be a silicon nitride layer.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (160, 162). Subsequently, the planarization dielectric layer 170 and the dielectric liners (160, 162) can be removed from an area to physically expose a top surface of the substrate semiconductor layer 9.

Optionally, a semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

At least one optional shallow trench can be formed through the dielectric pad layer 12 and an upper portion of the semiconductor material layer 10. The pattern of the at least one shallow trench can be selected such that lower select gate electrodes can be subsequently formed therein. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference.

A lower select gate structure 20 can be formed in each of the at least one shallow trench, for example, by forming a gate dielectric layer and at least one conductive material layer, and removing portions of the gate dielectric layer and the at least one conductive material layer from above the top surface of the dielectric pad layer 12, for example, by chemical mechanical planarization. Each lower select gate structure 20 can include a gate dielectric 22 and a gate electrode (24, 26). In one embodiment, each gate electrode (24, 26) can include a metallic liner 24 and a conductive material portion 26. The metallic liner 24 can include, for example, TiN, TaN, WN, or a combination thereof. The conductive material portion 26 can include, for example, W, Al, Cu, or combinations thereof. At least one optional shallow trench isolation structure (not shown) and/or at least one deep trench isolation structure (not shown) may be employed to provide electrical isolation among various semiconductor devices that are present, or are to be subsequently formed, on the substrate.

A dielectric cap layer 31 can be optionally formed. The dielectric cap layer 31 includes a dielectric material, and can be formed directly on top surfaces of the gate electrodes (24, 26). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrodes (24, 26).

A stack (32, 42, 142) of material layers is formed over the substrate (9, 10). The stack (32, 42, 142) comprises first material layers such as insulating layers 32, second material layers located between a respective pair of an overlying first material layer and an underlying first material layer, and at least one temporary material layer 142 located between a respective pair of an overlying first material layer and an underlying first material layer. Each second material layer can contact a bottom surface of the overlying first material layer and a top surface of the underlying first material layer. Each temporary material layer 142 can contact a bottom surface of the overlying first material layer and a top surface of the underlying first material layer. In one embodiment, the second material layers can be sacrificial material layers 42. In one embodiment, the at least one temporary material layer 142 can overlie at least one sacrificial material layer. The at least one temporary material layer 142 can be a single temporary material layer or a plurality of temporary material layers. The at least one temporary material layer may, or may not, underlie at least one sacrificial material layer. As used herein, a "temporary material" refers to a material that is present on a structure during at least one processing step, and is removed from the structure prior to completion of the structure, i.e., prior to the termination of the last processing step. As used herein, a "temporary material layer" refers to a material layer that including a temporary material.

The at least one temporary material layer 142 and the second material layers 42 comprise different materials. In one embodiment, the at least one temporary material layer 142 comprises a semiconductor material and the second material layers 42 comprise a dielectric material. In one embodiment, the at least one temporary material layer 142 can comprise an elemental semiconductor material or an alloy of at least two semiconductor materials (such as silicon, germanium, a silicon-germanium alloy, or a compound semiconductor), or a compound semiconductor material. In one embodiment, the at least one temporary material layer 142 comprises polysilicon, amorphous silicon, a polycrystalline silicon-germanium alloy, or an amorphous silicon-germanium alloy.

The stack (32, 42, 142) of layers includes an alternating plurality of first material layers (which can be insulating layers 32) and second material layers (which can be sacrificial material layer 42). The alternating plurality of first and second material layers is formed over the top surface of the substrate (9, 10), e.g., for example, on the top surface of the dielectric cap layer 31. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers. The alternating plurality of first material layers and second material layers end with an instance of the first material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer can be a sacrificial material layer 42. In this case, the stack (32, 42, 142) can include an alternating plurality of insulator layers 32 and sacrificial material layers 42.

The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the sacrificial material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an electrically insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be material layers that comprise silicon nitride or a semiconductor material including germanium or a silicon-germanium alloy. Alternatively, if the sacrificial material layers 42 comprise semiconductor layers, then the temporary material layer 142 may comprise silicon nitride.

In one embodiment, the insulator layers 32 can include silicon oxide, and sacrificial material layers 42 can include silicon nitride. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the sacrificial material layers 42 can be formed, for example, CVD or atomic layer deposition (ALD).

Optionally, the sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulator layers 32 and the sacrificial material layers 42 can be in a range from 20 nm to 50 nm, although lesser and greater thicknesses can be employed for each insulator layer 32 and for each sacrificial material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes such as source select gate electrodes and drain select gate electrodes. In one embodiment, each sacrificial material layer 42 in the alternating stack (32, 42) can have a uniform thickness that is substantially invariant within each respective sacrificial material layer 42.

At least one temporary material layer 142 is formed over the alternating plurality (32, 42) of first material layers and second material layers. The least one temporary material layer 142 can include a single temporary material layer or a plurality of vertically spaced temporary material layers. The at least one temporary material layer 142 includes a material that can be removed selective to the first material of the insulator layers 32 and selective to the second material of the sacrificial material layers 42.

In one embodiment, the insulator layers 32 can include silicon oxide, the sacrificial material layers 42 can include silicon nitride, and the at least one temporary material layer 142 can include a semiconductor material. The semiconductor material of the at least one temporary material layer 142 can be, for example, a Group IV semiconductor material, a III-V compound semiconductor material, a II-VI semiconductor material, or an organic semiconductor material. In an illustrative example, the semiconductor material can be amorphous silicon or polysilicon.

In another embodiment, the insulator layers 32 can include silicon oxide, the sacrificial material layers 42 can include a semiconductor material that can be etched selective to the semiconductor material of the semiconductor material layer 10, and the at least one temporary material layer 142 can include silicon nitride. The semiconductor material of the sacrificial material layers 42 can be, for example, germanium, a silicon-germanium alloy, a III-V compound semiconductor material, a II-VI semiconductor material, or an organic semiconductor material.

Each temporary material layer 142 can be formed, for example, by chemical vapor deposition (CVD), atomic layer deposition (ALD), or a combination thereof. The thickness of each temporary material layer 142 can be in a range from 15 nm to 50 nm, although lesser and greater thicknesses can also be employed.

Optionally, at least one pair of a first material layer and a second material layer can be formed over the at least one temporary material layer 142. In one embodiment, each first material layer formed over the at least one temporary material layer 142 can be an insulator layer 32, and each second material layer formed over the at least one temporary material layer 142 can be a sacrificial material layer 42.

Optionally, an insulating cap layer 70 can be formed over the stack (32, 42, 142) of material layers. The insulating cap layer 70 includes a dielectric material that is different from the material of the sacrificial material layers 42 and from the material of the at least one temporary material layer 142. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70, the at least one temporary material layer 142, and the alternating stack (32, 42), and can be lithographically patterned to form openings therein. The pattern in the lithographic material stack can be transferred through the insulating cap layer 70, the at least one temporary material layer 142, the sacrificial material layers 42, and the insulator layers 32 by at least one anisotropic etch that employs the patterned lithographic material stack as an etch mask. Portions of the insulating cap layer 70, the at least one temporary material layer 142, the sacrificial material layers 42, and the insulator layers 32 underlying the openings in the patterned lithographic material stack are etched to form memory openings 49. In other words, the transfer of the pattern in the patterned lithographic material stack through the insulating cap layer 70, the at least one temporary material layer 142, the sacrificial material layers 42, and the insulator layers 32 forms the memory openings 49 that extend through the insulating cap layer 70, the at least one temporary material layer 142, the sacrificial material layers 42, and the insulator layers 32. The chemistry of the anisotropic etch process employed to etch through the materials of the alternating stack (32, 42) underlying the at least one temporary material layer 142 can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the stack (32, 42, 142) of material layers to the top surface of the semiconductor material layer 10 within the substrate between the lower select gate electrodes (24, 26). In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the exemplary structure during formation of an exemplary memory stack structure according to a first embodiment of the present disclosure. Formation of the exemplary memory stack structure can be performed within each of the memory openings 49 in the exemplary structure illustrated in FIG. 1.

Referring to FIG. 2A, a memory opening 49 is illustrated immediately after formation thereof. The memory opening 49 extends through the insulating cap layer 70, the stack (32, 42, 142) of material layers, the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, a series of layers including at least one blocking dielectric layer 502L, a memory material layer 504L, a tunneling dielectric layer 505L, and an optional first semiconductor channel layer 601C can be sequentially deposited in the memory openings 49. The at least one blocking dielectric layer 502L can include, for example, a first blocking dielectric layer (not separately shown) and a second blocking dielectric layer (not separately shown). Alternatively, the blocking dielectric layer may be omitted from the memory opening, and instead be formed through the backside contact trench in recesses formed by removal of the sacrificial layers 42 prior to forming the metal control gate electrodes through the backside contact trench.

In an illustrative example, the first blocking dielectric layer can be deposited on the sidewalls of each memory opening 49 by a conformal deposition method. The first blocking dielectric layer includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer can include a dielectric metal oxide having a dielectric constant greater than 7.9, i.e., having a dielectric constant greater than the dielectric constant of silicon nitride. In one embodiment, the first blocking dielectric layer includes aluminum oxide. The second blocking dielectric layer can be formed on the first blocking dielectric layer. The second blocking dielectric layer can include a dielectric material that is different from the dielectric material of the first blocking dielectric layer. In one embodiment, the second blocking dielectric layer can include silicon oxide, a dielectric metal oxide having a different composition than the first blocking dielectric layer, silicon oxynitride, silicon nitride, or a combination thereof. In one embodiment, the second blocking dielectric layer can include silicon oxide.

Subsequently, the memory material layer 504L, the tunneling dielectric layer 505L, and the optional first semiconductor channel layer 601C can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 505L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 505L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 505L can include a stack of a first silicon oxide layer, a silicon oxynitride layer, and a second silicon oxide layer, which is commonly known as an ONO stack. In one embodiment, the tunneling dielectric layer 505L can include a silicon oxide layer that is substantially free of carbon or a silicon oxynitride layer that is substantially free of carbon. The thickness of the tunneling dielectric layer 505L can be in a range from 2 nm to 20 nm, although lesser and greater thicknesses can also be employed.

The optional first semiconductor channel layer 601C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601C includes amorphous silicon or polysilicon. The first semiconductor channel layer 601C can be formed by a conformal deposition method such as low pressure chemical vapor deposition (LPCVD). The thickness of the first semiconductor channel layer 601C can be in a range from 2 nm to 10 nm, although lesser and greater thicknesses can also be employed. A cavity 49' is formed in the volume of each memory hole 49 that is not filled with the deposited material layers (502L, 504L, 505L, 601L).

Referring to FIG. 2C, the optional first semiconductor channel layer 601C, the tunneling dielectric layer 505L, the memory material layer 504L, the at least one blocking dielectric layer 502L are sequentially anisotropically etched employing at least one anisotropic etch process. The portions of the first semiconductor channel layer 601C, the tunneling dielectric layer 505L, the memory material layer 504L, and the at least one blocking dielectric layer 502L located above the top surface of the insulating cap layer 70 can be removed by the at least one anisotropic etch process. Further, the horizontal portions of the first semiconductor channel layer 601C, the tunneling dielectric layer 505L, the memory material layer 504L, and the at least one blocking dielectric layer 502L at a bottom of each cavity 49' can be removed to form openings in remaining portions thereof. Each of the first semiconductor channel layer 601C, the tunneling dielectric layer 505L, the memory material layer 504L, and the at least one blocking dielectric layer 502L can be etched by anisotropic etch process.

Each remaining portion of the first semiconductor channel layer 601C constitutes a first semiconductor channel portion 601. Each remaining portion of the tunneling dielectric layer 505L constitutes a tunneling dielectric 505. Each remaining portion of the memory material layer 504L is herein referred to as a charge storage element 504. In one embodiment, the charge storage element 504 can be a contiguous layer, i.e., can be a charge storage layer. Each remaining portion of the at least one blocking dielectric layer is herein referred to as at least one blocking dielectric 502. A surface of the semiconductor material layer 10 can be physically exposed underneath the opening through the first semiconductor channel portion 601, the tunneling dielectric 505, the charge storage element 504, and the at least one blocking dielectric 502. Optionally, the physically exposed semiconductor surface at the bottom of each cavity 49' can be vertically recessed so that the recessed semiconductor surface underneath the cavity 49' is vertically offset from the topmost surface of the semiconductor material layer 10 by a recess distance. A tunneling dielectric 505 is embedded within a charge storage element 504. The charge storage element 504 can comprise a charge trapping material or a floating gate material.

In one embodiment, the first semiconductor channel portion 601, the tunneling dielectric 505, the charge storage element 504, and the at least one blocking dielectric 502 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2D, a second semiconductor channel layer 602C can be deposited directly on the semiconductor surface of the semiconductor material layer 10 in the substrate (9, 10), and directly on the first semiconductor channel portion 601. The second semiconductor channel layer 602C includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602C includes amorphous silicon or polysilicon. The second semiconductor channel layer 602C can be formed by a conformal deposition method such as low pressure chemical vapor deposition (LPCVD). The thickness of the second semiconductor channel layer 602C can be in a range from 2 nm to 10 nm, although lesser and greater thicknesses can also be employed. The second semiconductor channel layer 602C may partially fill the cavity 49' in each memory opening, or may fully fill the cavity in each memory opening.

The materials of the first semiconductor channel portion 601 and the second semiconductor channel layer 602C are collectively referred to as a semiconductor channel material. In other words, the semiconductor channel material is a set of all semiconductor material in the first semiconductor channel portion 601 and the second semiconductor channel layer 602C.

Referring to FIG. 2E, in case the cavity 49' in each memory opening is not completely filled by the second semiconductor channel layer 602C, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2F, the horizontal portion of the dielectric core layer 62L can be removed, for example, by a recess etch from above the top surface of the insulating cap layer 70. Further, the horizontal portion of the second semiconductor channel layer 602C located above the top surface of the insulating cap layer 70 can be removed by a planarization process, which can employ a recess etch or chemical mechanical planarization (CMP). Each remaining portion of the second semiconductor channel layer 602C within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 505 is embedded within a charge storage element 504, and laterally surrounds a portion of the semiconductor channel 60. Each adjoining set of at least one blocking dielectric 502, a charge storage element 504, and a tunneling dielectric 505 collectively constitute a memory film 50, which can store electrical charges with a macroscopic retention time. As used herein, a macroscopic retention time refers to a retention time suitable for operation of a memory device as a permanent memory device such as a retention time in excess of 24 hours. Each remaining portion of the dielectric core layer 62L constitutes a dielectric core 62. Alternatively, the at least one blocking dielectric layer 502 may be omitted from the memory opening, and instead be formed through the backside contact trench in recesses formed as a dielectric liner by removal of the sacrificial layers 42 prior to forming the metal control gate electrodes through a backside contact trench.

The dielectric core 62 can be recessed so that the top surface of the dielectric core 62 is formed below the horizontal plane including the top surface of the insulating cap layer 70. A doped semiconductor material can be deposited within a recess above the dielectric core 62, and excess portions of the doped semiconductor material can be removed from above the horizontal plane including the top surface of the insulating cap layer 70 by a planarization process such as chemical mechanical planarization or a recess etch. The remaining portion of the doped semiconductor material constitutes a drain region 63. The drain region 63 is formed directly on the semiconductor channel 60.

In one embodiment, the semiconductor channel 60 can have a doping of a first conductivity type at a first dopant concentration, and the drain region 63 can have a doping of a second conductivity type that is the opposite of the first conductivity type. For example, the semiconductor channel 60 can have a p-type doping, and the drain region 63 can have an n-type doping. The dopant concentration of the drain region 63 can be higher than the first dopant concentration.

The exemplary memory stack structure can be embedded into the exemplary structure illustrated in FIG. 1. FIG. 3 illustrates the exemplary structure that incorporates multiple instances of the exemplary memory stack structure of FIG. 2F. The exemplary structure includes a semiconductor device, which comprises a stack (32, 42, 142) of material layers. The stack (32, 42, 142) of material layers includes an alternating plurality of insulator layers 32 and sacrificial material layers 42 located over a semiconductor substrate (9, 10), at least one temporary material layer 142 and a memory opening extending through the stack (32, 42). If the at least one temporary material layer 142 comprises a plurality of temporary material layers, a second alternating plurality of insulator layers 32 and temporary material layers 142 may be present over a first alternating plurality of insulator layers 32 and sacrificial material layers 42. The semiconductor device further comprises at least one blocking dielectric 502 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

At least one dielectric cap layer (71, 72) can be optionally formed over layer 70. In one embodiment, the at least one dielectric cap layer (71, 72) can include a first dielectric cap layer (71, 72) and a second dielectric cap layer 72. In one embodiment, the first and second dielectric cap layers (71, 72) can include dielectric materials such as silicon oxide, a dielectric metal oxide, and/or silicon nitride.

Figure 4:
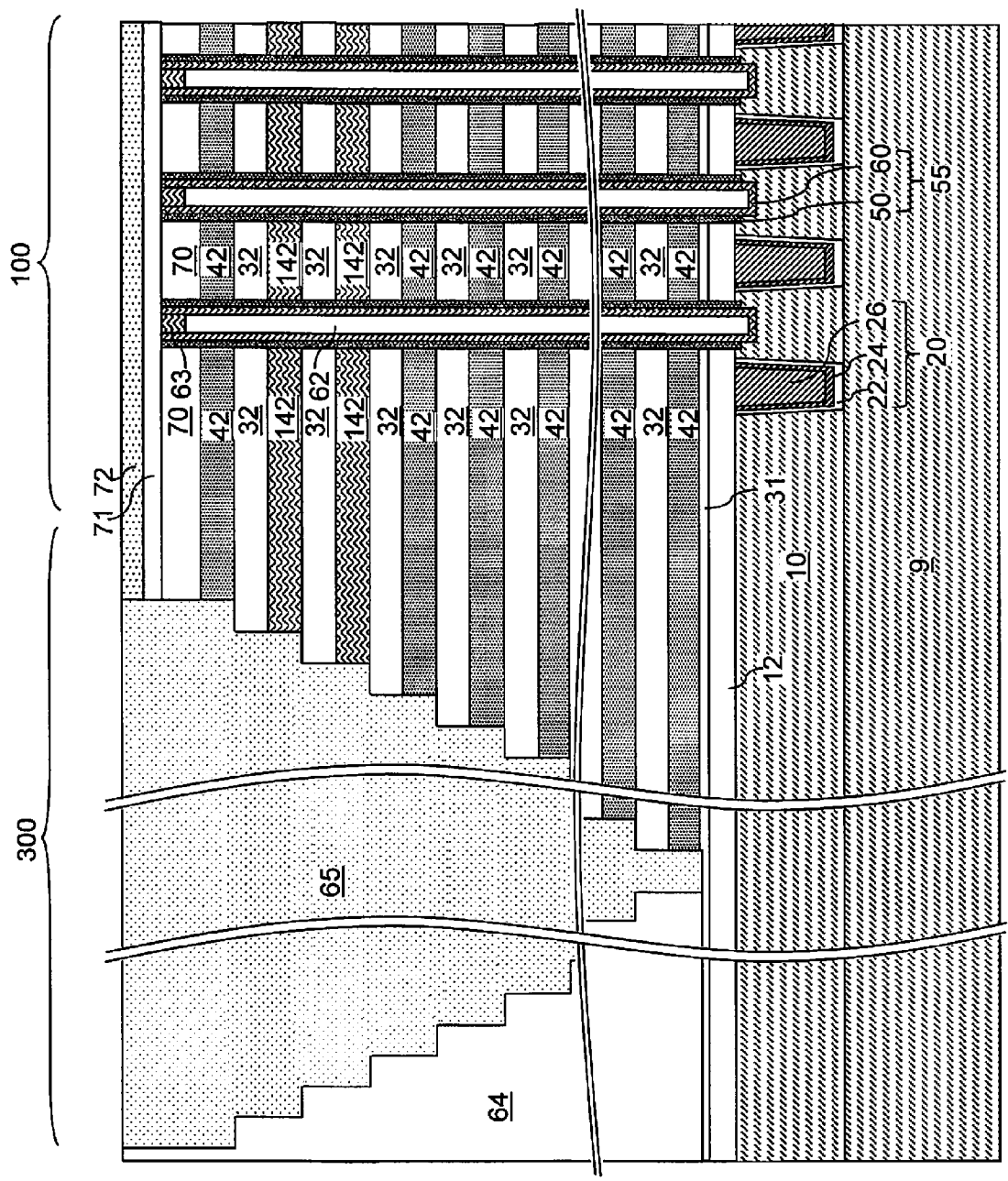
FIG. 4 is a vertical cross-sectional view of the exemplary structure after formation of a stepped terrace and a retro-stepped dielectric material portion according to an embodiment of the present disclosure.

Referring to FIG. 4, a portion of the stack (32, 42, 142) of material layers can be optionally removed, for example, by applying and patterning a photoresist layer with an opening and by transferring the pattern of the opening through the stack (32, 42, 142) of material layers employing an etch such as an anisotropic etch. An optional trench extending through the entire thickness of the stack (32, 42, 142) of material layers can be formed. Subsequently, the trench can be filled with an optional dielectric material such as silicon oxide. Excess portions of the dielectric material can be removed from above the top surface of the at least one dielectric cap layer (71, 72) by a planarization process such as chemical mechanical planarization and/or a recess etch. The top surfaces of the at least one dielectric cap layer (71, 72) can be employed as a stopping surface during the planarization. The remaining dielectric material in the trench constitutes a dielectric material portion 64.

A stepped cavity can be formed within a contact region 300, which is adjoined to a device region 100 including an array of memory stack structures 55. The contact region 300 can straddle the dielectric material portion 64 and a portion of the stack (32, 42, 142) of material layers. Alternatively, formation of the dielectric material portion 64 may be omitted and the stepped cavity 69 may be formed directly in the stack (32, 42, 142). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the stack (32, 42, 142) of material layers can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer (71, 72), for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
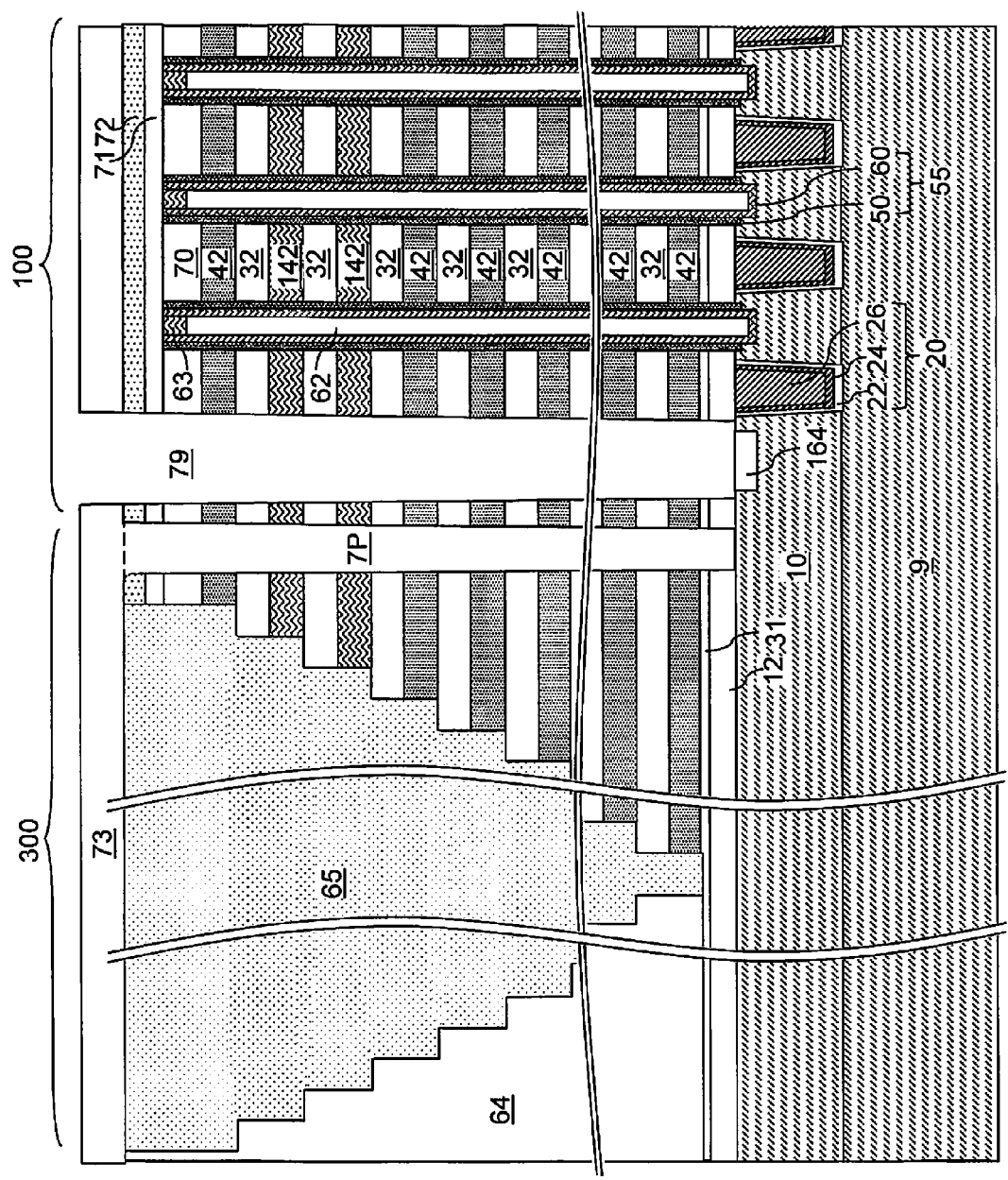
FIG. 5A is a vertical cross-sectional view of the exemplary structure after optional formation of a dielectric pillar structure and formation of a backside via cavity according to an embodiment of the present disclosure.
Figure 5B:
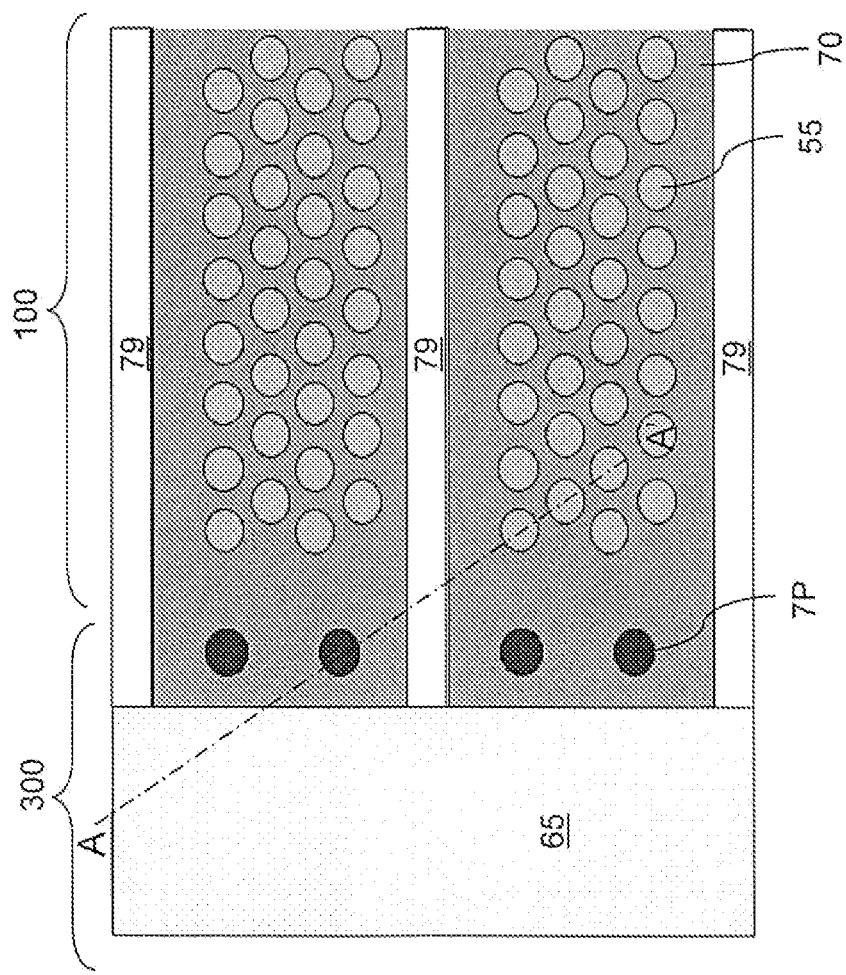
FIG. 5B is a see-through top-down view of the exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the stack (32, 42, 142) of material layers. In one embodiment, the at least one dielectric support pillar 7P can be formed in a contact region 300, which is located adjacent to a device region 100. The at least one dielectric support pillar 7P can be formed, for example, by forming an opening extending through the retro-stepped dielectric material portion 65 and/or through the stack (32, 42, 142) of material layers and at least to the top surface of the substrate (9, 10), and by filling the opening with a dielectric material that is resistant to the etch chemistry to be employed to remove the sacrificial material layers 42. In one embodiment, the at least one dielectric support pillar can include silicon oxide and/or a dielectric metal oxide such as aluminum oxide. In one embodiment, the portion of the dielectric material that is deposited over the at least one dielectric cap layer (71, 72) concurrently with deposition of the at least one dielectric support pillar 7P can be present over the at least one dielectric cap layer (71, 72) as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer (71, 72) concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer (71, 72) can be physically exposed.

A photoresist layer (not shown) can be applied over the stack (32, 42, 142) of material layers and/or the retro-stepped dielectric material portion 65, and optionally over the and lithographically patterned to form at least one backside contact trench 79 in an area in which formation of a backside contact via structure is desired. The pattern in the photoresist layer can be transferred through the stack (32, 42, 142) of material layers and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed. If desired, a source region 164 may be formed by implantation of dopant atoms into a portion of the semiconductor material layer 10 through the backside contact trench 79.

Figure 6:
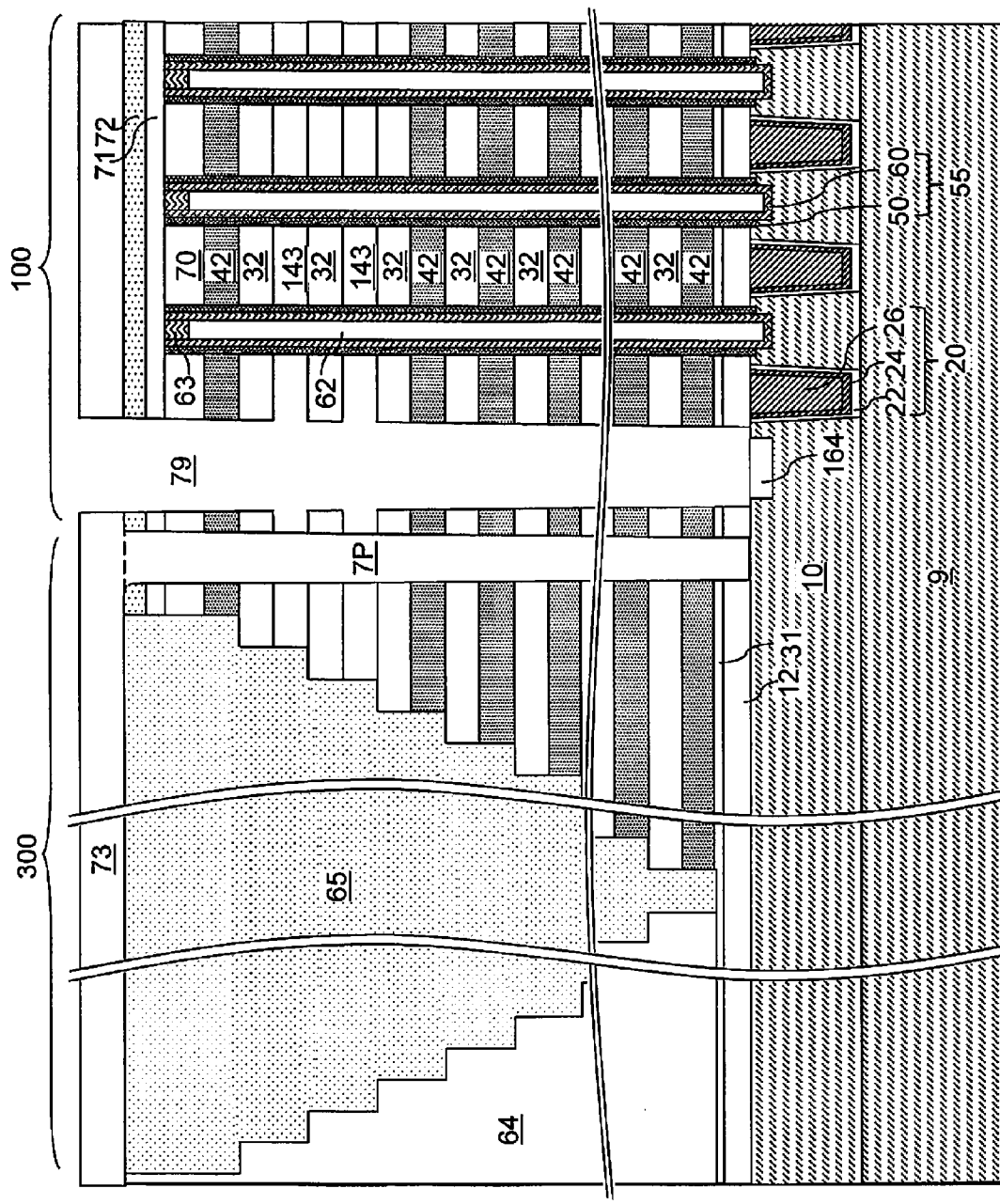
FIG. 6 is a vertical cross-sectional view of the exemplary structure after removal of the temporary material layers and formation of first backside cavities according to an embodiment of the present disclosure.

Referring to FIGS. 6 and 7A, at least one first backside recess 143 can be formed by removing the at least one temporary material layer 142. Specifically, a first etchant that selectively etches the material of the at least one temporary material layer 142 with respect to the first material of the insulator layers 32 and the second material of the sacrificial material layers 42 can be introduced into the at least one backside contact trench 79, for example, employing an etch process. A first backside recess 143 is formed in each volume from which a temporary material layer 142 is removed. In other words, the at least one first backside recess 143 is formed as the etchant etches the at least one temporary material layer 142. Each first backside recess 143 is herein referred to as a first-type drain-select-level backside recess. Each first backside recess 143 is a backside recess that is located at a drain-select level, i.e., the level at which drain select electrodes are to be subsequently formed. As used herein, a "front side opening" refers to an opening (e.g., opening 49) through a stack of material layers within which a memory film 50 is subsequently formed, and a "front side recess" refers to a lateral recess that is formed from a front side opening. As used herein, a "backside opening" refers to an opening (e.g., trench 79) that is formed at the outside of a memory film 50 or outside of a plurality of memory films 50, and a "backside recess" refers to a lateral recess that is formed at the outside of a memory film 50 or outside of a plurality of memory films 50. In one embodiment, the removal of the material of the temporary material layer 142 can be selective to the first material of the insulator layers 32, to the second material of the sacrificial material layers 42, to the material of the at least one dielectric support pillar 7P, to the material of the retro-stepped dielectric material portion 65, and optionally to the semiconductor material of the semiconductor material layer 10.

In one embodiment, each temporary material layer 142 can include silicon nitride, and the materials of the insulator layers 32, the at least one dielectric support pillar 7P, and the retro-stepped dielectric material portion 65 can be selected from silicon oxide and dielectric metal oxides. In this case, the sacrificial material layers 42 can include a semiconductor material such as germanium, a silicon-germanium alloy, amorphous silicon, a compound semiconductor material, or an organic semiconductor material.

In another embodiment, each temporary material layer 142 can include a semiconductor material such as polysilicon, and the materials of the insulator layers 32, the at least one dielectric support pillar 7P, and the retro-stepped dielectric material portion 65 can be selected from silicon oxide and dielectric metal oxides. In this case, the sacrificial material layers 42 can include silicon nitride. Optionally, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the material of the temporary material layer 142 selective to the first material and the second material can be a wet etch process employing a wet etch solution, or can be a gas phase (dry) etch process in which the etchant is introduced in a vapor phase into the at least one backside contact trench 79. For example, if the temporary material layer 142 includes silicon nitride, the etch process can be a wet etch process in which the exemplary structure is immersed within a wet etch tank including phosphoric acid, which etches silicon nitride selective to silicon oxide, silicon, and various other materials employed in the art.

Referring to FIG. 7B, each portion of memory film 50 physically exposed to the at least one first backside recess 143 can be removed by at least one etch process, which can be a series of isotropic etch processes. The chemistry of each isotropic etch process can be selected to sequentially remove the various materials of the memory films 50 from outside to inside. If each memory film 50 includes at least one blocking dielectric 502, a charge storage region 504, and a tunneling dielectric 505, a first isotropic etch process can etch each physically exposed portion of the at least one blocking dielectric 502 to expand the at least one first backside recess 143, a second isotropic etch process can etch each physically exposed portion of the charge storage element 504 to further expand the at least one first backside recess 143, and a third isotropic etch process can etch each physically exposed portion of the tunneling dielectric 505 to further expand the at least one first backside recess 143. At least one etch processes among the series of isotropic etch processes can be selective to materials of the insulator layers 32 and the insulating cap layer 70. The isotropic etch process that etches the material of the tunneling dielectric 505 can be selective to the material of the first semiconductor channel portion 601.

The series of isotropic etch process can form an annular cavity 243 at each level of the at least one first backside recess 143 around each memory opening. Each annular cavity 243 is formed as a portion of the at least one first backside recess 143. As used herein, an "annular" cavity refers to a cavity having an annular shape, i.e., the shape of an annulus (a ring). Each isotropic etch process can optionally undercut the corresponding etched material layers 502, 504 and/or 505 in the vertical direction. Each annular cavity 243 can have a top portion that protrudes above the horizontal plane including the bottom surface of the overlying insulator layer 32 (or the insulating cap layer 70 if the cavity 243 is located at the top of the stack), and can have a bottom portion that protrudes below the horizontal plane including the top surface of the underlying insulator layer 32. A vertical surface of each semiconductor channel 60 is physically exposed in the recesses 143 after the series of isotropic etch processes.

Thus, each first backside recess 143 can be formed by removing the at least one temporary material layer 142 and each portion of the memory film 50 that adjoins the at least one temporary material layer 142. Each first backside recess laterally extends to a respective portion of an outer sidewall of the semiconductor channel 60.

In one embodiment, the device region 100 comprises an array of monolithic three-dimensional NAND strings having a plurality of device levels disposed above the substrate (9, 10). The at least one first backside recess 143 can define a space for receiving a drain select gate electrode of the array of monolithic three-dimensional NAND strings. The at least one first backside recess 143 can extend substantially parallel to the top surface of the substrate (9, 10). The at least one first backside recess 143 can be vertically bounded by a top surface of an underlying insulator layer 32 and a bottom surface of the overlying insulator layer 32 (or the insulating cap layer 70 if the recess 143 is located at the top of the stack). In one embodiment, the at least one first backside recess 143 can have a uniform height throughout.

In one embodiment, the at least one first backside recess 143 can be a plurality of first backside recesses, and the memory film 50 can be cut into a plurality of disjoined memory film portions (50A, 50B). At least one 50A of the disjoined memory film portions (50A, 50B) can be formed between a vertically neighboring pair of first backside recesses 143, and can have an annular shape.

Referring to FIG. 7C, electrical dopants are introduced through each physically exposed portion of the outer sidewall of the semiconductor channel 60 and into each respective adjoining portion of the semiconductor channel 60. The regions of the semiconductor channel 60 into which the electrical dopants are introduced can be converted into a doped semiconductor channel portion 603 that is present within the semiconductor channel 60.

The electrical dopants can be introduced through the physically exposed portion of the outer sidewall of the semiconductor channel 60. In one embodiment, the conductivity of the electrical dopants can be the same as the conductivity type of the semiconductor channel 60 prior to introduction of the electrical dopants. The electrical dopants can be p-type dopants or n-type dopants depending on the conductivity type of the semiconductor channel 60 prior to introduction of the electrical dopants. Exemplary p-type dopants include B, Ga, and In. Exemplary n-type dopants include P, As, and Sb. The portion of the semiconductor channel 60 into which the electrical dopants are introduced is converted into a doped semiconductor channel portion 603.

The electrical dopants can be introduced into physically exposed portions of the semiconductor channels 60 by a plasma doping process and/or a gas phase doping process.

In a plasma doping process, the exemplary structure is placed in a process chamber in which a plasma of the electrical dopants is generated. Non-limiting examples of process gases from which the plasma can be generated include $B_2H_6$, $PH_3$, $AsH_3$, and $SbH_3$. In a gas phase doping process, the exemplary structure is placed in a process chamber, and is subjected to a dopant gas at an elevated temperature, which can be, for example, in a range from 600 degrees Celsius to 1,000 degrees Celsius. The atomic concentration of the electrical dopants in the doped semiconductor channel portion 603 can be in a range from $1\times10^{17}/cm^3$ to $1\times10^{21}/cm^3$, including $1\times10^{18}/cm^3$ to $1\times10^{21}/cm^3$ such as $1\times10^{19}/cm^3$ to $1\times10^{21}/cm^3$, although lesser and greater atomic concentrations can also be employed.

Within each memory opening, the doped semiconductor channel portion 603 can be formed as a single contiguous material portion. The portion of the first semiconductor channel layer 601 that underlies the doped semiconductor channel portion 603 is herein referred to as a lower first semiconductor channel portion 601L, and the portion of the first semiconductor channel layer 601 that overlies the doped semiconductor channel portion 603 is herein referred to as an upper first semiconductor channel portion 601U. The portion of the second semiconductor channel layer 602 that underlies the doped semiconductor channel portion 603 is herein referred to as a lower second semiconductor channel portion 602L, and the portion of the second semiconductor channel layer 602 that overlies the doped semiconductor channel portion 603 is herein referred to as an upper second semiconductor channel portion 602U. The lower first semiconductor channel portion 601L and the lower second semiconductor channel portion 602L collectively constitute a lower semiconductor channel portion (601L, 602L). The upper first semiconductor channel portion 601U and the upper second semiconductor channel portion 602U collectively constitute a upper semiconductor channel portion (601U, 602U).

The doped semiconductor channel portion 603 includes the same semiconductor material as the remaining portions of the semiconductor channel 60, and further includes the electrical dopants. In one embodiment, the composition of the doped semiconductor channel portion 603 can differ from the composition of the lower semiconductor channel portion (601L, 602L) and the upper semiconductor channel portion (601U, 602U) only by the presence of the additional electrical dopant atoms in the doped semiconductor channel portion 603. In one embodiment, the lower semiconductor channel portion (601L, 602L) and the upper semiconductor channel portion (601U, 602U) can be substantially free of electrical dopants, i.e., can be intrinsic. In another embodiment, the lower semiconductor channel portion (601L, 602L) and the upper semiconductor channel portion (601U, 602U) can have electrical dopants of the same type as the doped semiconductor channel portion 603 at a lower concentration. Optionally, the outer surface of the channel portion 603 exposed in the back side recesses 143 may be oxidized to form a gate oxide (i.e., gate dielectric). Alternatively, the oxidation step may be omitted if the back side blocking dielectric layer 41 will be formed in the back side recesses as will be described below.

Referring to FIG. 7D, second backside recesses 43 can be formed by removing the second material layers (such as the sacrificial material layers 42) selective to the first material layers (such as the insulator layers 32) and selective to an outermost layer of the memory film 50 and to the semiconductor channel 60. A second etchant that selectively etches the second material of the sacrificial material layers 42 with respect to the first material of the insulator layers 32 and the material of the semiconductor channel 60 can be introduced into the at least one backside contact trench 79, for example, employing an etch process. The second backside recesses 43 are formed in volumes from which the sacrificial material layers 42 are removed. The second backside recesses 43 that are located underneath the at least one first backside recess 143 and optionally above the at least one backside recesses 143. The removal of the second material of the sacrificial material layers 42 can be selective to the first material of the insulator layers 32, the material of the at least one dielectric support pillar 7P, the material of the retro-stepped dielectric material portion 65, the semiconductor material of the doped semiconductor channel portion 603, and the semiconductor material of the semiconductor material layer 10. In one embodiment, the sacrificial material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as germanium, and the materials of the insulator layers 32, the at least one dielectric support pillar 7P, and the retro-stepped dielectric material portion 65 can be selected from silicon oxide, silicon nitride, and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the second backside recesses 43 are present within volumes previously occupied by the sacrificial material layers 42.

Each second backside recess 43 can be a laterally extending cavity having a lateral dimension that is greater than the vertical extent of the cavity. In other words, the lateral dimension of each second backside recess 43 can be greater than the height of the second backside recess 43. A plurality of second backside recesses 43 can be formed in the volumes from which the second material of the sacrificial material layers 42 is removed. The memory openings in which the memory stack structures 55 are formed are herein referred to as front side recesses or front side cavities in contrast with the second backside recesses 43. In one embodiment, the device region 100 comprises an array of monolithic three-dimensional NAND strings having a plurality of device levels disposed above the substrate (9, 10). In this case, each second backside recess 43 can define a space for receiving a respective word line of the array of monolithic three-dimensional NAND strings.

Each of the plurality of second backside recesses 43 can extend substantially parallel to the top surface of the substrate (9, 10). A second backside recess 43 can be vertically bounded by a top surface of an underlying insulator layer 32 and a bottom surface of an overlying insulator layer 32. In one embodiment, each second backside recess 43 can have a uniform height throughout. In an embodiment, the memory film 50 is exposed in each second backside recess 43 but is not removed.

Figure 7E:
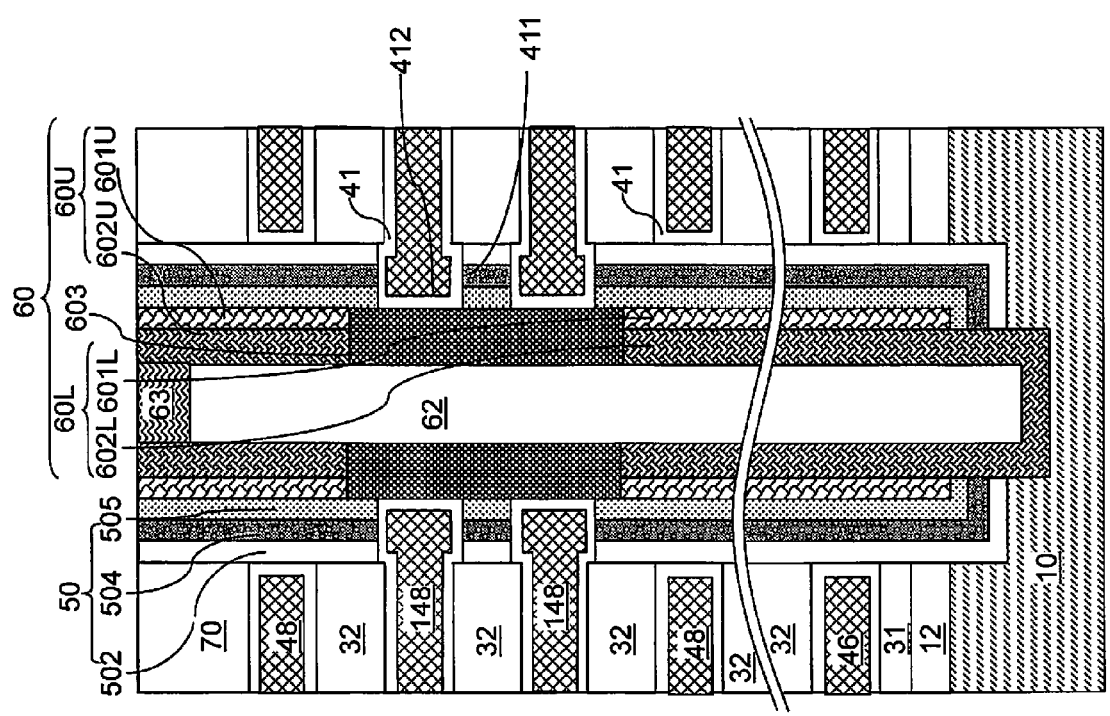
Figure 8:
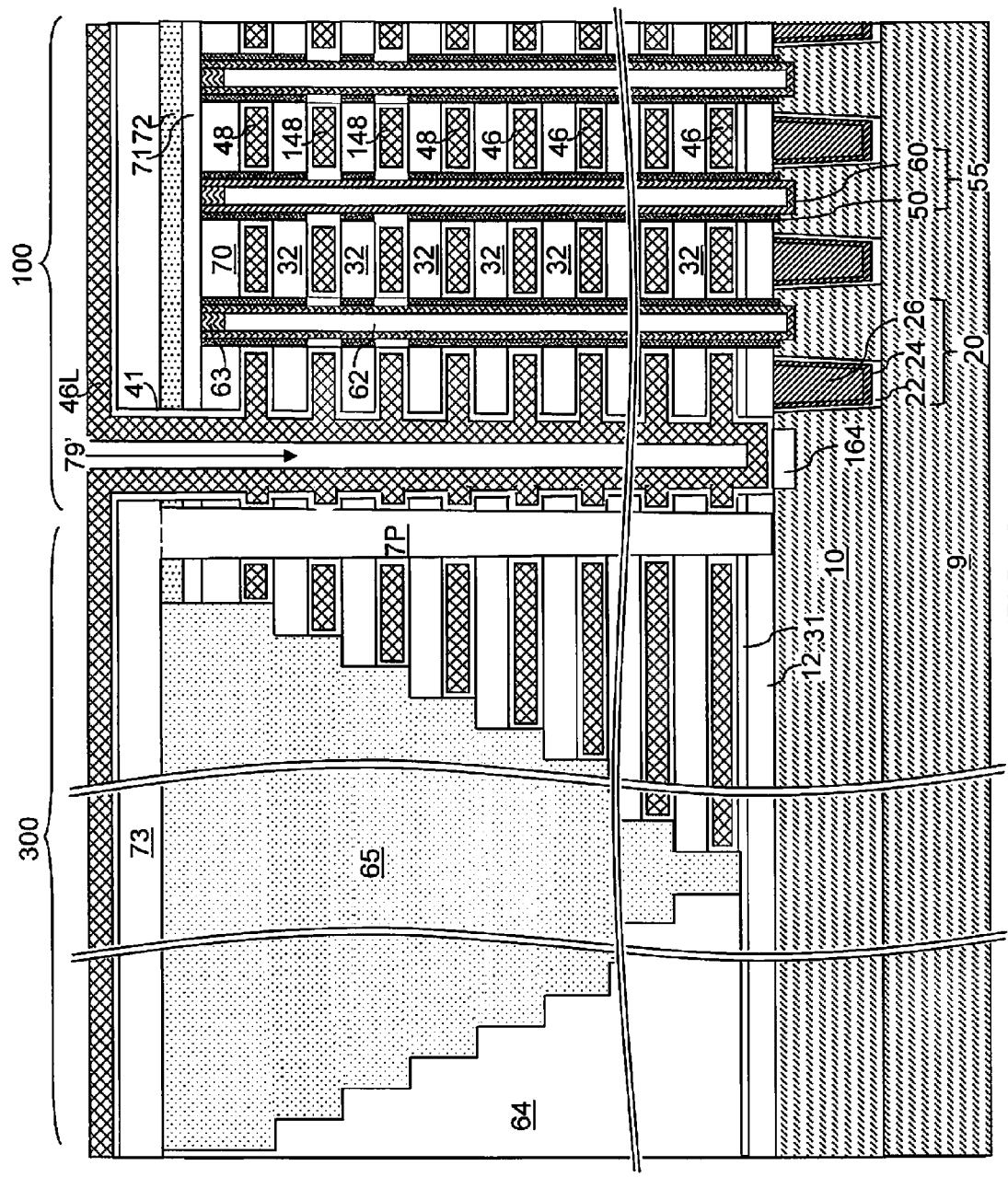
FIG. 8 is a vertical cross-sectional view of the exemplary structure after formation of the electrically conductive layers according to an embodiment of the present disclosure.

Referring to FIGS. 7E and 8, the at least one first backside recess 143 and the plurality of second backside recesses 43 can be simultaneously filled with a combination of a dielectric liner and a conductive material. The conductive material forms electrically conductive layers (46, 48, 148, 46L). Specifically, a dielectric material is deposited to form a contiguous dielectric liner, which is employed to block leakage of electrical charges from the charge storage elements 504 to drain select gate electrode layers to be subsequently formed within the volume of the at least one first backside recess 143 and/or to control gate electrode layers to be subsequently formed within the volumes of the second backside recesses 43. The contiguous dielectric liner is herein referred to as a backside blocking dielectric layer 41. The backside blocking dielectric layer 41 includes a dielectric material such as silicon oxide, a dielectric metal oxide, silicon nitride, or a combination thereof. In one embodiment, the backside blocking dielectric layer 41 can include a stack of a silicon oxide layer and a dielectric metal oxide layer (e.g., aluminum oxide). The backside blocking dielectric layer 41 can be deposited by a conformal deposition method such as low pressure chemical vapor deposition (LPCVD), atomic layer deposition (ALD), or a combination thereof. The thickness t of the backside blocking dielectric layer 41 is less than one half of the height of the second backside recesses 43, and is less than one half of the height of the at least one first backside recess 143. In one embodiment, the thickness t of the backside blocking dielectric layer 41 can be in a range from 3 nm to 20 nm, although lesser and greater thicknesses can also be employed.

Around each memory opening, the backside blocking dielectric layer 41 is formed on a sidewall of the doped semiconductor channel portion 603 at each level of the at least one temporary material layer 142, and on surfaces of the memory film 50 at each level of the sacrificial material layers 42. Around each annular cavity 243 located around a memory opening, the backside blocking dielectric layer 41 is formed on a sidewall of the doped semiconductor channel portion 603 to form a gate insulating layer of the select transistor(s), on a top surface of a remaining portion of the memory film 50 (which is located under a horizontal plane including the top surface of the topmost insulator layer 32), and on a bottom surface of another remaining portion of the memory film 50 (which is located above a horizontal plane including the bottom surface of the insulating cap layer 70).

Subsequently, the conductive material can be deposited in the remaining cavities of the plurality of second backside recesses 43, in the remaining cavity of the at least one first backside recess 143, over the sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of second backside recesses 43 and the at least one first backside recess 143 include tungsten, tungsten nitride, titanium, titanium nitride, tantalum, and tantalum nitride. In one embodiment, the conductive material can comprise a metal such as tungsten and/or metal nitride. In one embodiment, the conductive material for filling the plurality of second backside recesses 43 and the at least one first backside recess 143 can be selected from tungsten and a combination of titanium nitride and tungsten. In one embodiment, the conductive material can be deposited by chemical vapor deposition.

Various electrically conductive layers (46, 48) can be formed in the plurality of second backside recesses 43, at least another electrically conductive layer 148 can be formed in the at least one first backside recess 143, and a contiguous conductive material layer 46L can be formed on the sidewalls of each backside contact trench 79 and over the dielectric pillar material layer 73 (or the topmost layer of the exemplary structure in case the dielectric pillar material layer 73 is not employed). The electrically conductive layers (46, 48) formed in the second backside recesses 43 include control gate electrically conductive layers 46 that function as control gate electrodes, and optionally include at least one first-type select gate electrically conductive layer 48 that functions as at least one drain select gate electrode. As used herein, a "control gate electrically conductive layer" is an electrically conductive layer that functions as a control gate electrode, and a "select gate electrically conductive layer" is an electrically conductive layer that functions as a select gate electrode, i.e., an electrode that selects a semiconductor channel among a plurality of semiconductor channels. The at least another electrically conductive layer 148 formed in the at least one first backside recesses 143 include at least one second-type select gate electrically conductive layer 148 that functions as at least another drain select gate electrode.

The control gate electrically conductive layers 46 constitute a first set of control gate electrically conductive layers 46, the at least one second-type select gate electrically conductive layer 148 constitutes a second set of at least one electrically conductive layer 148, and the optional at least one first-type select gate electrically conductive layer 48 constitutes a third set of at least one electrically conductive layer 48.

The plurality of insulator layers 32 and the plurality of control gate electrically conductive layers 46 collectively constitute an alternating plurality (32, 46) of insulator layers 32 and control gate electrically conductive layers 46. Each electrically conductive layer 48 that is formed in the at least one first backside recess 143 is a select gate electrically conductive layer 48. Thus, each sacrificial material layer 42 can be replaced with a control gate electrically conductive layer 46 or a first-type select gate electrically conductive layer 48, and each temporary material layer 142 can be replaced with a second-type select gate electrically conductive layer 148.

A respective portion of backside blocking dielectric layer 41 at the level of each second-type select gate electrically conductive layer 148 can be in contact with a doped semiconductor channel portion 603. A respective portion of the backside blocking dielectric layer 41 at the level of each control gate electrically conductive layers 46 and each first-type select gate electrically conductive layer 48 can be laterally spaced from the semiconductor channel 60 by a memory film 50. In one embodiment, the backside blocking dielectric layer 41 can be formed by a conformal deposition method, and can have the same composition and thickness throughout.

In one embodiment, the memory film 50 can comprise a tunneling dielectric 505, a charge storage element 504 embodied as a charge trapping layer and laterally surrounding the tunneling dielectric 505, and at least one blocking dielectric 502 laterally surrounding the charge trapping layer. In one embodiment, the thickness of the memory film 50 can be the same as the sum of the thickness of the tunneling dielectric 505, the thickness of the charge storage element 504, and the thickness of the at least one blocking dielectric 502.

In one embodiment, the first dielectric liner portion 411 can contact a top surface of the at least one blocking dielectric 502 and a top surface of the charge trapping layer 504. In one embodiment, the at least one blocking dielectric 502 can contact a sidewall of each second dielectric liner portion 412 and a bottom surface of the first dielectric liner portion 411.

Thus, as shown in FIG. 7E, the semiconductor channel 60 includes a lower intrinsic semiconductor channel portion 60L, a middle doped semiconductor channel portion 603 contacting an upper end of the lower intrinsic semiconductor channel portion 60L, and optionally an upper intrinsic semiconductor channel portion 60U contacting the upper portion of the middle doped semiconductor channel portion 603. A first subset of the electrically conductive layers comprises a plurality of control gate electrodes 46 and at least one first drain select gate electrode 48 which are located laterally adjacent to the lower semiconductor channel portion 60L. A second subset of the electrically conductive layers comprises at least one second drain select gate electrode 148, such as a plurality of electrodes 148, which are located laterally adjacent to the middle semiconductor channel portion 603. Optionally, a third subset of the electrically conductive layers comprises at least one third drain select gate electrode 48 which is located laterally adjacent to the upper semiconductor channel portion 60U. The drain region 63 is located above the upper semiconductor channel portion 60U. The drain region 63 has a doping of opposite conductivity type (e.g., n-type) from the conductivity type (e.g., p-type) of the middle doped semiconductor channel portion 603.

Figure 9:
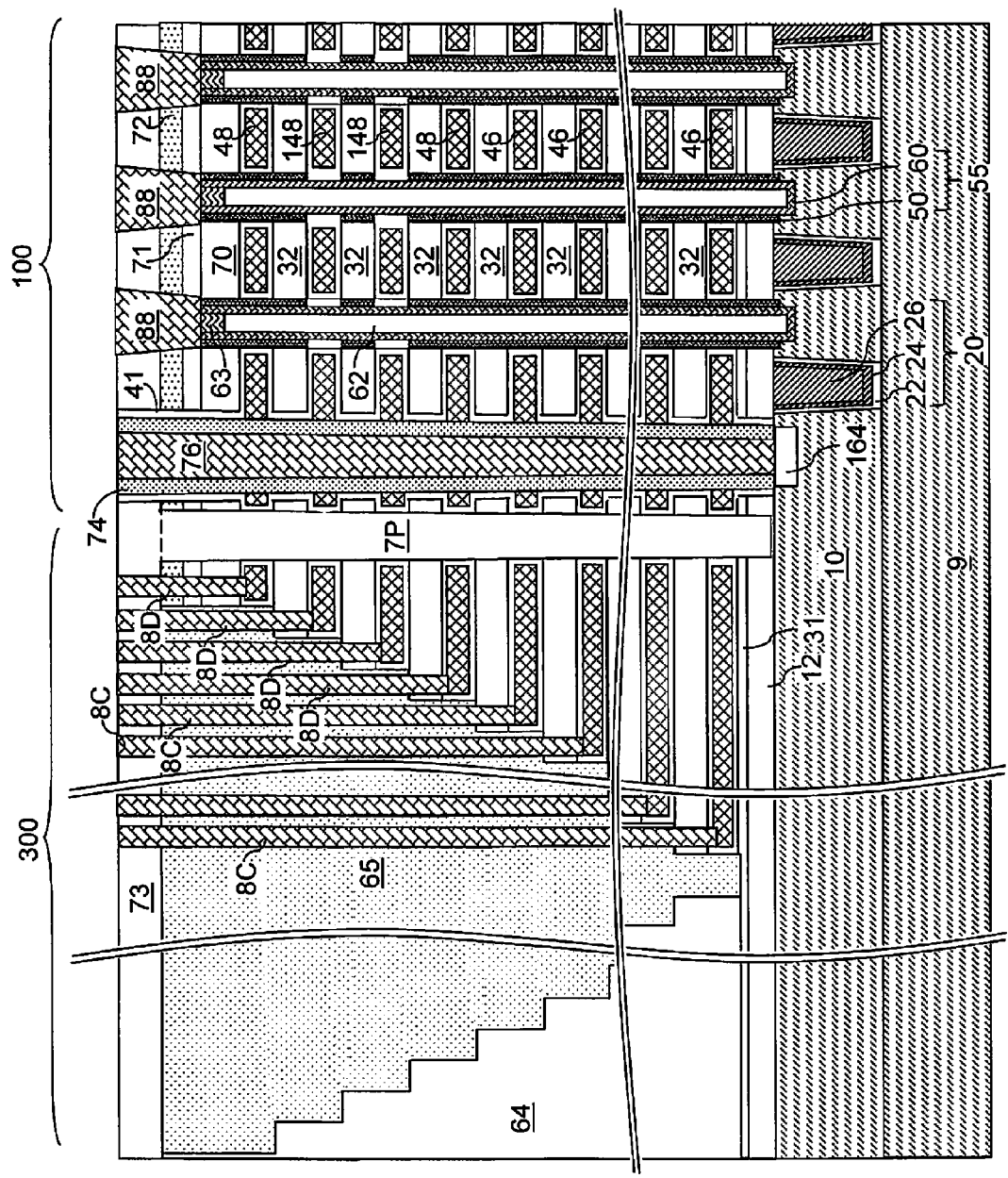
FIG. 9 is a vertical cross-sectional view of the exemplary structure after formation of a backside insulating spacer, a backside contact via structure, and additional contact via structures according to an embodiment of the present disclosure.

Referring to FIG. 9, the deposited conductive material of the contiguous conductive material layer 46L is etched back from the sidewalls of each backside contact trench 79 and from above the dielectric pillar material layer 73 (or the topmost layer of the exemplary structure in case the dielectric pillar material layer 73 is not employed), for example, by an isotropic etch.

Each control gate electrically conductive layer 46 can function as a combination of a plurality of control gate electrodes and a word line electrically connecting, i.e., electrically shorting, the plurality of control gate electrodes. The plurality of control gate electrodes within each control gate electrically conductive layer 46 can include control gate electrodes located at the same level for the vertical memory devices including the memory stack structures 55. In other words, each control gate electrically conductive layer 46 can be a word line that functions as a common control gate electrode for the plurality of vertical memory devices. The drain-level electrically conductive layers 48, 148 can function as a plurality of drain select gate electrodes for multiple memory stack structures 55 and a drain select gate line electrically connecting the plurality of drain select gate electrodes.

An insulating spacer 74 can be formed on the sidewalls of the backside contact trench 79 by deposition of a contiguous dielectric material layer and an anisotropic etch of its horizontal portions. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154; See FIG. 1), and at least one active region via cavity can be formed such that the bottom surface of each active region via cavity is a surface of an active region 100. In one embodiment, different types of via cavities can be formed separately employing multiple combinations of photoresist layers and anisotropic etch processes. The vertical extent of each gate via cavity, as measured from the top surface of the dielectric pillar material layer 73 to the bottom surface of the gate via cavity, can be less than the vertical distance between the top surface of the dielectric pillar material layer 73 and the topmost surface of the alternating plurality (32, 46) of the insulator layers 32 and the control gate electrically conductive layers 46. The photoresist layer can be subsequently removed, for example, by ashing.

Another photoresist layer (not shown) can be applied over the exemplary structure, and can be lithographically patterned to form openings within the contact region 300 in which formation of contact via structures for the control gate electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective control gate electrically conductive layer 46.

In addition, another photoresist layer (not shown) can be applied over the exemplary structure, and can be lithographically patterned to form openings that overlie the array of drain regions 63 in the device region 100. Drain contact via cavities can be formed through the dielectric pillar material layer 73, the at least one dielectric cap layer (71, 72), upper portions of the dielectric cores 62, and optionally remaining portions of the memory film 50 located above the top surfaces of the drain regions 63. Each drain contact via cavity can extend downward from the top surface of the horizontal portion of the backside blocking dielectric layer 41 located above the dielectric pillar material layer 73, or, if the horizontal portion of backside blocking dielectric layer 41 is removed collaterally during recessing of the contiguous conductive material layer 46L, from the top surface of the dielectric pillar material layer 73 or from the top surface of the at least one dielectric cap layer (71, 72). Each drain contact via cavity extends at least to the top surface of an underlying drain region 63.

The trench cavity laterally surrounded by the insulating spacer 74, the control gate contact via cavities in the contact region 300, and the drain contact via cavities in the device region 100 can be filled with a conductive material to form various contact via structures. For example, a backside contact via structure 76 to the source region 164 can be formed in the cavity surrounded by the insulating spacer 74.

Control gate contact via structures 8C can be formed within each contact via cavity that extends to a top surface of the control gate electrically conductive layers 46 in the contact region 300. At least one drain select contact via structure 8D can be formed within each contact via cavity that extends to a top surface of a select gate electrically conductive layer 48 or to a top surface of a second-type select gate electrically conductive layer 148 in the contact region 300.

Similarly, drain contact via structures 88 can be formed to provide electrical contact to the drain regions 63. Each drain contact via structure 88 can extend through the entirety of the at least one dielectric cap layer (71, 72), the entirety of the dielectric pillar material layer 73 (if present), and the topmost horizontal portion of the backside blocking dielectric layer 41 (if present). Each drain contact via structure 88 further extends at least through an upper portion of a memory opening between the horizontal plane including the top surface of the insulating cap layer 70 and the horizontal plane including the top surfaces of the drain regions 63.

Figure 10:
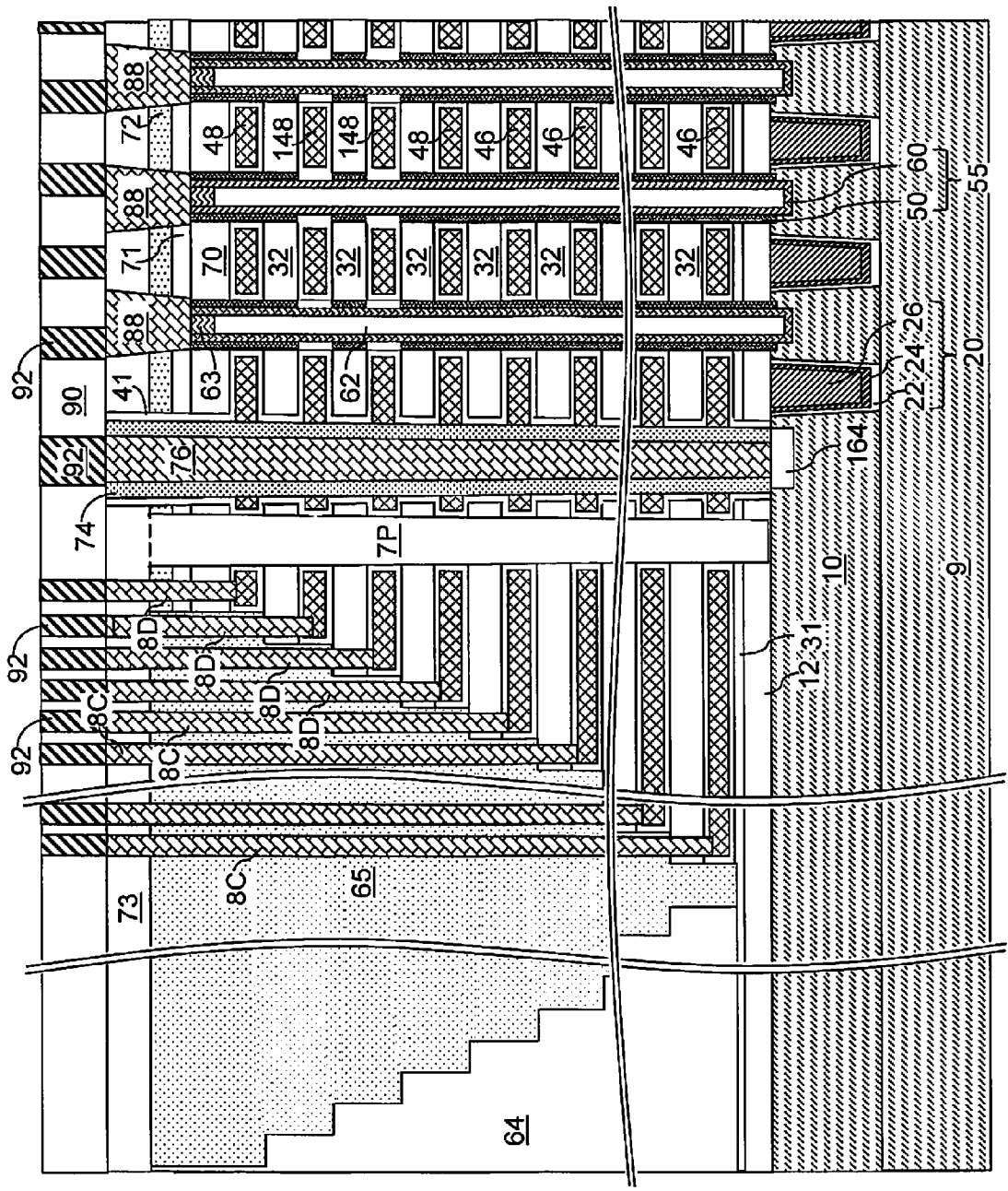
FIG. 10 is a vertical cross-sectional view of the exemplary structure after formation of conductive line structures according to an embodiment of the present disclosure.

Referring to FIG. 10, a line-level dielectric layer 90 can be formed over the dielectric pillar material layer 73. The line-level dielectric layer 90 can include silicon oxide, organosilicate glass, silicon nitride, and/or a dielectric metal oxide The thickness of the line-level dielectric layer 90 can be in a range from 30 nm to 1,000 nm, although lesser and greater thicknesses can also be employed.

Various conductive line structures 92 can be formed in the line-level dielectric layer 90 to provide electrical contact to the various contact via structures (76, 88, 8C, 8D). The control gate electrically conductive layers 46 can function as control gate electrodes for the memory stack structures 55 in the device region.

Additional metal interconnect structures (not shown) can be optionally formed, which can include at least one dielectric material layer, at least one conductive via structure, and at least one additional conductive line structure. The additional metal interconnect structure can be formed on the top surface of the conductive line structure 92 and the line-level dielectric layer 90.

The exemplary semiconductor structure comprises a stack (32, 46, 48, 148) including an alternating plurality of insulator layers 32 and electrically conductive layers (46, 48, 148) located over a substrate (9, 10); a memory opening extending through the stack (32, 46, 48, 148); and a memory film 50 and a semiconductor channel 60 located within the memory opening. The semiconductor channel 60 comprises a first semiconductor channel portion, i.e., the lower semiconductor channel portion (601L, 602L), having a first material composition that includes a semiconductor material. The semiconductor channel 60 further comprises a second semiconductor channel portion, i.e., the doped semiconductor channel portion 603, contacting an upper end of the first semiconductor channel portion and having a second material composition that includes the semiconductor material. The second material composition differs from the first material composition by presence of electrical dopant atoms (e.g., the higher doping concentration).

A first subset 46 of the electrically conductive layers (46, 48, 148) that consists of the control gate electrically conductive layers 46 is laterally spaced from the first semiconductor channel portion (601L, 602L) by the memory film 50 and a respective first portion of a backside blocking dielectric layer 41. Each first portion of the backside blocking dielectric layer 41 contacts an outer sidewall of the memory film 50.

A second subset 148 of the electrically conductive layers (46, 48, 148) that consists of the at least one second-type select gate electrically conductive layer 148 is laterally spaced from the second semiconductor channel portion 603 by no more than a respective second portion of the backside blocking dielectric layer 41. In other words, the distance between each second-type select gate electrically conductive layer 148 and the doped semiconductor channel portion 603 can be the same as the thickness of the backside blocking dielectric layer 41. Each second portion of the backside blocking dielectric layer 41 contacts an outer sidewall of the second semiconductor channel portion 603.

In one embodiment, the second subset 148 of the electrically conductive layers (46, 48, 148) can comprise at least two second-type select gate electrically conductive layers 148, and the memory film 50 can comprise an annular memory film portion 50A (See FIG. 7D) located between a pair of electrically conductive layers 148 within the second subset. In one embodiment, the memory film 50 comprises an annular memory film portion overlying the second subset of the electrically conductive layers. The second subset 148 of the electrically conductive layers (46, 48, 148) comprises at least one drain select gate electrode of a monolithic three-dimensional memory structure. Preferably, the second subset 148 of the electrically conductive layers (46, 48, 148) comprises at least another drain select gate electrode of the monolithic three-dimensional memory structure such that the second subset comprises a plurality of drain select gate electrodes 148.

In one embodiment, the backside blocking dielectric layer 41 can comprise a dielectric metal oxide having a dielectric constant greater than 7.9. The memory film 50 can comprise a tunneling dielectric 505 in contact with an entirety of an outer sidewall of the first semiconductor channel portion (601L, 602L), a charge trapping layer 504 laterally surrounding the tunneling dielectric 505, and optionally at least one blocking dielectric 502 laterally surrounding the charge trapping layer 504. Optionally, an outer sidewall of the second semiconductor material portion 603 contacts the tunnel dielectric 505 and at least one second portion of the backside blocking dielectric layer 41. In other words, the portion 603 vertically overlaps a portion of the tunneling dielectric 505, as shown in FIG. 7E. In one embodiment, the second semiconductor channel portion 603 has an annular shape and laterally surrounds a dielectric core 62.

The semiconductor channel 60 can comprise a third semiconductor channel portion (601U, 602U) having the first material composition (i.e., the same composition as the composition of the first semiconductor channel portion (601L, 602L)) and contacting an upper portion of the second semiconductor channel portion 603. The first, second, and third semiconductor channel portions {(601L, 602L), 603, (601U, 602U)} can be annular, and can have vertically coincident sidewalls. A drain region 63 contacts an upper end of the semiconductor channel 60, and specifically, the inner sidewall of the third semiconductor channel portion (601U, 602U).

In one embodiment, the device located on the semiconductor substrate can include a vertical NAND device located in the device region 100, and at least one of the control gate electrically conductive layers 46 in the stack (32, 46) can comprise, or can be electrically connected to, a word line of the NAND device, as shown in FIGS. 9-10. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory film 50. Each charge storage region is located adjacent to a respective one of the plurality of semiconductor channels 60. The device region 100 further includes a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The plurality of control gate electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel 60 and at least one charge storage region located adjacent to the semiconductor channel 60. At least one end portion of the semiconductor channel 60 extends substantially perpendicular to the top surface of the semiconductor substrate through the stack (32, 46).

In a non-limiting illustrative example, the insulating layers 32 can comprise silicon oxide layers, the plurality of word lines 46 can comprise tungsten or a combination of titanium nitride and tungsten, the at least one charge storage region can comprises a plurality of floating gates or a charge trapping layer located between the tunneling dielectric layer and the blocking dielectric layer. An end portion of each of the plurality of word lines 46 in a device region can comprise a control gate electrode located adjacent to the at least one charge storage region. A plurality of contact via structures contacting the word lines 46 can be located in a contact region 300. The plurality of word lines 46 extends from the device region 100 to the contact region 300. The backside contact via structure 76 can be a source line that extends through a dielectric insulated trench, i.e., the backside contact trench 79 filled with the dielectric spacer 74 and the backside contact via structure 76, in the stack to electrically contact the source region 164. The source region 164 can be in contact with the horizontal portion of the semiconductor channel in an upper portion of the semiconductor material layer 10. A drain line, as embodied as a conductive line structure 92 that contacts a drain contact via structure 88, electrically contacts an upper portion of the semiconductor channel (601, 602). As used herein, a first element "electrically contacts" a second element if the first element is electrically shorted to the second element.

An array of drain regions 63 contacts a respective semiconductor channel 60 within the array of memory stack structures 55. A top surface of the dielectric material layer, i.e., the insulating cap layer 70, can be coplanar with top surfaces of the drain regions 63.

The additional first conductivity dopants (e.g., p-type dopants introduced into a p-type or an intrinsic channel) that are introduced into the doped semiconductor channel portion 603 provide adjustment to the threshold voltage of the vertical drain side select field effect transistor that is present within the three-dimensional vertical NAND device. Specifically, the concentration of the first conductivity dopants in the doped semiconductor channel portion 603 can be selected such that the threshold voltage and leakage current characteristics of the semiconductor channel 60 are optimized. Because only the backside blocking dielectric layer 41 is present between each second-type select gate electrically conductive layer (i.e., select gate electrode) 148 and the semiconductor channel 60, drain select gate cutoff characteristics can be improved through use of the at least one second-type select gate electrically conductive layer 148. At least one first-type select gate electrically conductive layer 48 is optional, i.e., it may, or may not be employed.

The exemplary structure of the present disclosure does not require drain select gate programming for the purpose of adjusting the threshold voltage. Further, there is no threshold voltage downshift concern. Gas phase doping and selective gate replacement can apply the semiconductor channel doping for three-dimensional structures. The size of the doped region, i.e., the size of the doped semiconductor channel portion 603, can be determined by the thickness of each temporary material layer 142. Further, the drain select gate electrodes 48 can have a non-doped transistor at each level of the at least one first-type select gate electrically conductive layer 48, which can be employed to support turn-on and turn-off of the semiconductor channel junction area.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory structure, comprising:
   a stack including an alternating plurality of insulator layers and electrically conductive layers located over a substrate;
   a memory opening extending through the stack; and
   a memory film and a semiconductor channel located within the memory opening, wherein the semiconductor channel comprises:
   a first semiconductor channel portion having a first material composition that includes a semiconductor material;
   a second semiconductor channel portion contacting an upper end of the first semiconductor channel portion and having a doping of a first conductivity type, wherein the first semiconductor channel portion is intrinsic or has a doping of the first conductivity type at a lower dopant concentration than the second semiconductor channel portion; and
   a drain region located above the second semiconductor channel portion, having a doping of a second conductivity type that is the opposite of the first conductivity type, and contacting an upper end of the semiconductor channel,
   wherein a first subset of the electrically conductive layers is laterally spaced from the first semiconductor channel portion by the memory film and a respective first portion of a backside blocking dielectric layer; and wherein a second subset of the electrically conductive layers is laterally spaced from the second semiconductor channel portion, and a respective second portion of the backside blocking dielectric layer is the only layer formed between the second subset of the electrically conductive layers and the second semiconductor channel portion.

2. The monolithic three-dimensional memory structure of claim 1, wherein each first portion of the backside blocking dielectric layer contacts an outer sidewall of the memory film.

3. The monolithic three-dimensional memory structure of claim 1, wherein each second portion of the backside blocking dielectric layer contacts an outer sidewall of the second semiconductor channel portion.

4. The monolithic three-dimensional memory structure of claim 1, wherein the second subset of the electrically conductive layers comprises at least two electrically conductive layers, and the memory film comprises an annular memory film portion located between a pair of electrically conductive layers within the second subset.

5. The monolithic three-dimensional memory structure of claim 1, wherein the memory film comprises an annular memory film portion overlying the second subset of the electrically conductive layers.

6. The monolithic three-dimensional memory structure of claim 1, wherein the second subset of the electrically conductive layers comprises at least one drain select gate electrode of the monolithic three-dimensional memory structure.

7. The monolithic three-dimensional memory structure of claim 1, wherein the backside blocking dielectric layer comprises a dielectric metal oxide having a dielectric constant greater than 7.9.

8. The monolithic three-dimensional memory structure of claim 1, wherein the memory film comprises:
 a tunneling dielectric in contact with an entirety of an outer sidewall of the first semiconductor channel portion;
 a charge trapping layer laterally surrounding the tunneling dielectric; and
 at least one blocking dielectric laterally surrounding the charge trapping layer.

9. The monolithic three-dimensional memory structure of claim 8, wherein an outer sidewall of the second semiconductor channel portion contacts the tunneling dielectric and at least one second portion of the backside blocking dielectric layer.

10. The monolithic three-dimensional memory structure of claim 1, wherein the second semiconductor channel portion has an annular shape and laterally surrounds a dielectric core.

11. The monolithic three-dimensional memory structure of claim 1, further comprising a third semiconductor channel portion having the first material composition and contacting an upper portion of the second semiconductor channel portion.

12. The monolithic three-dimensional memory structure of claim 11, wherein the first, second, and third semiconductor channel portions are annular, and have vertically coincident sidewalls.

13. The monolithic three-dimensional memory structure of claim 12, wherein the third semiconductor channel portion contacts the drain region, and the second semiconductor channel portion does not contact the drain region.

14. The monolithic three-dimensional memory structure of claim 1, further comprising a drain contact via structure contacting a top surface of the drain region.

15. The monolithic three-dimensional memory structure of claim 1, wherein:
 the monolithic three-dimensional memory structure comprises a vertical NAND device located in a device region; and
 at least one of the electrically conductive layers in the stack comprises, or is electrically connected to, a word line of the vertical NAND device that is located adjacent to the memory film.

16. The monolithic three-dimensional memory structure of claim 15, wherein:
 the substrate comprises a silicon substrate;
 the vertical NAND device comprises array of monolithic three-dimensional NAND strings over the silicon substrate;
 at least one memory cell in the first device level of the three-dimensional array of NAND strings is located over another memory cell in the second device level of the three-dimensional array of NAND strings;
 the silicon substrate contains an integrated circuit comprising a driver circuit for the memory device located thereon; and
 each NAND string comprises:
  a plurality of instances of the semiconductor channel, wherein at least one end portion of each instance of the plurality of instances of the semiconductor channel extends substantially perpendicular to a top surface of the substrate;
  a plurality of charge storage elements comprising portions of a plurality of instances of the memory film, each charge storage element located adjacent to a respective one of the plurality of instances of the semiconductor channel; and
  a plurality of control gate electrodes comprising portions of the electrically conductive layers and having a strip shape extending substantially parallel to the top surface of the substrate, the plurality of control gate electrodes comprise at least a first control gate electrode located in the first device level and a second control gate electrode located in the second device level.

17. A monolithic three-dimensional memory structure, comprising:
 a stack including an alternating plurality of insulator layers and electrically conductive layers located over a substrate;
 a memory opening extending through the stack; and
 a memory film and a semiconductor channel located within the memory opening, wherein the semiconductor channel comprises:
 a first semiconductor channel portion having a first material composition that includes a semiconductor material;
 a second semiconductor channel portion contacting an upper end of the first semiconductor channel portion and having a doping of a first conductivity type, wherein the first semiconductor channel portion is intrinsic or has a doping of the first conductivity type at a lower dopant concentration than the second semiconductor channel portion; and
 a drain region located above the second semiconductor channel portion, having a doping of a second conductivity type that is the opposite of the first conductivity type, and contacting an upper end of the semiconductor channel, wherein a first subset of the electrically conductive layers is laterally spaced from the first semiconductor channel portion by the memory film and a respective first portion of a backside blocking dielectric layer;

wherein the memory film comprises:
- a tunneling dielectric in contact with an entirety of an outer sidewall of the first semiconductor channel portion;
- a charge trapping layer laterally surrounding the tunneling dielectric; and
- at least one blocking dielectric laterally surrounding the charge trapping layer; and wherein an outer sidewall of the second semiconductor channel portion contacts the tunneling dielectric and at least one second portion of the backside blocking dielectric layer.

18. The monolithic three-dimensional memory structure of claim 17, wherein each first portion of the backside blocking dielectric layer contacts an outer sidewall of the memory film.

19. The monolithic three-dimensional memory structure of claim 17, wherein a second subset of the electrically conductive layers is laterally spaced from the second semiconductor channel portion, and a respective second portion of the backside blocking dielectric layer is the only layer formed between the second subset of the electrically conductive layers and the second semiconductor channel portion.

20. The monolithic three-dimensional memory structure of claim 19, wherein each second portion of the backside blocking dielectric layer contacts an outer sidewall of the second semiconductor channel portion.

21. The monolithic three-dimensional memory structure of claim 19, wherein the second subset of the electrically conductive layers comprises at least two electrically conductive layers, and the memory film comprises an annular memory film portion located between a pair of electrically conductive layers within the second subset.

22. The monolithic three-dimensional memory structure of claim 19, wherein the memory film comprises an annular memory film portion overlying the second subset of the electrically conductive layers.

23. The monolithic three-dimensional memory structure of claim 19, wherein the second subset of the electrically conductive layers comprises at least one drain select gate electrode of the monolithic three-dimensional memory structure.

24. The monolithic three-dimensional memory structure of claim 17, wherein the backside blocking dielectric layer comprises a dielectric metal oxide having a dielectric constant greater than 7.9.

25. The monolithic three-dimensional memory structure of claim 17, wherein the second semiconductor channel portion has an annular shape and laterally surrounds a dielectric core.

26. The monolithic three-dimensional memory structure of claim 17, further comprising a third semiconductor channel portion having the first material composition and contacting an upper portion of the second semiconductor channel portion.

27. The monolithic three-dimensional memory structure of claim 26, wherein the first, second, and third semiconductor channel portions are annular, and have vertically coincident sidewalls.

28. The monolithic three-dimensional memory structure of claim 27, wherein the third semiconductor channel portion contacts the drain region, and the second semiconductor channel portion does not contact the drain region.

29. The monolithic three-dimensional memory structure of claim 17, further comprising a drain contact via structure contacting a top surface of the drain region.

30. The monolithic three-dimensional memory structure of claim 17, wherein:
- the monolithic three-dimensional memory structure comprises a vertical NAND device located in a device region; and
- at least one of the electrically conductive layers in the stack comprises, or is electrically connected to, a word line of the vertical NAND device that is located adjacent to the memory film.

31. The monolithic three-dimensional memory structure of claim 30, wherein:
- the substrate comprises a silicon substrate;
- the vertical NAND device comprises array of monolithic three-dimensional NAND strings over the silicon substrate;
- at least one memory cell in the first device level of the three-dimensional array of NAND strings is located over another memory cell in the second device level of the three-dimensional array of NAND strings;
- the silicon substrate contains an integrated circuit comprising a driver circuit for the memory device located thereon; and
- each NAND string comprises:
  - a plurality of instances of the semiconductor channel, wherein at least one end portion of each instance of the plurality of instances of the semiconductor channel extends substantially perpendicular to a top surface of the substrate;
  - a plurality of charge storage elements comprising portions of a plurality of instances of the memory film, each charge storage element located adjacent to a respective one of the plurality of instances of the semiconductor channel; and
  - a plurality of control gate electrodes comprising portions of the electrically conductive layers and having a strip shape extending substantially parallel to the top surface of the substrate, the plurality of control gate electrodes comprise at least a first control gate electrode located in the first device level and a second control gate electrode located in the second device level.

* * * * *